US012801805B2

(12) United States Patent
Woolf et al.

(10) Patent No.: US 12,801,805 B2
(45) Date of Patent: Nov. 17, 2026

(54) TEMPERATURE-WEIGHTED UNIVERSAL NODE COORDINATION

(71) Applicant: Lineage Logistics, LLC, Irvine, CA (US)

(72) Inventors: Alexander James Woolf, San Francisco, CA (US); Stephen William Neel, Eugene, OR (US); Alison Nicole Williams, Colorado Springs, CO (US); Nadia Bolis, Berkeley, CA (US); Cameron Saylor, Davis, CA (US); Alessia Kelsey Levante, Lafayette, CA (US); Eric John Gallagher, Raleigh, NC (US); Kenneth Nguyen, San Diego, CA (US); Christopher Gullickson, McCall, ID (US)

(73) Assignee: Lineage Logistics, LLC, Irvine, CA (US)

( * ) Notice: Subject to any disclaimer, the term of this patent is extended or adjusted under 35 U.S.C. 154(b) by 0 days.

(21) Appl. No.: 19/086,313

(22) Filed: Mar. 21, 2025

(65) Prior Publication Data

US 2025/0298933 A1 Sep. 25, 2025

Related U.S. Application Data

(60) Provisional application No. 63/568,710, filed on Mar. 22, 2024.

(51) Int. Cl.
*G06F 30/18* (2020.01)

(52) U.S. Cl.
CPC .................................... *G06F 30/18* (2020.01)

(58) Field of Classification Search
CPC ....................................................... G06F 30/18
(Continued)

(56) References Cited

U.S. PATENT DOCUMENTS 6,595,847 B1 * 7/2003 Freese .................... A23B 2/708
454/118
6,862,499 B1 * 3/2005 Cretella ................. G05D 27/02
700/299
(Continued)

FOREIGN PATENT DOCUMENTS

CN 112799452 A 5/2021
CN 118152969 A 6/2024

OTHER PUBLICATIONS

Hazard Analysis and Risk-Based Preventative Controls for Human Food: Draft Guidance for Industry. FDA Guidance, Appendix 3: Bacterial Pathogen Growth and Inactivation. Aug. 2016, pp. 1-23.

*Primary Examiner* — Iftekhar A Khan
(74) *Attorney, Agent, or Firm* — Barnes & Thornburg LLP

(57) ABSTRACT

Disclosed is a system for interpolating ambient conditions across a facility, the system including: sensors to generate sensor data indicating ambient conditions in a facility and a computer system that can: receive the sensor data from the sensors, determine real-time temperature information for different locations of the facility based on processing the received sensor data, retrieve a machine learning model that was trained using historic facility data to interpolate ambient conditions across a facility using temperature information that corresponds to a portion of the facility, apply the model to the real-time temperature information for the different locations of the facility, determine, based on applying the machine learning model, real-time temperature information for the facility, and return the real-time temperature information for the facility.

10 Claims, 10 Drawing Sheets

(58) Field of Classification Search
USPC ........................................................ 703/1
See application file for complete search history.

(56) References Cited

U.S. PATENT DOCUMENTS 10,323,878 B1* 6/2019 Woolf .................. G05B 13/042
10,620,084 B2* 4/2020 Santarone ............... G06F 30/13
10,902,160 B2* 1/2021 Wodrich ................... G01S 5/10
11,157,870 B2* 10/2021 Brightwell ......... G06Q 30/0637
11,181,316 B2* 11/2021 Woolf ..................... F25D 13/00
2004/0226309 A1* 11/2004 Broussard ............. F25D 11/003 62/236
2005/0261991 A1* 11/2005 Kennamer ............. G06Q 10/08 705/28
2006/0219842 A1* 10/2006 Shell ...................... B64D 13/06 244/118.5
2007/0258048 A1* 11/2007 Pitchers ............. G06K 19/0717 353/26 R
2011/0221573 A1* 9/2011 Huat ...................... G05D 23/19 340/10.1
2012/0111044 A1* 5/2012 Chen .................... B60H 1/3232 62/207
2014/0048609 A1* 2/2014 Chen ........................ F24F 11/58 165/223
2015/0135737 A1* 5/2015 Cresswell ............... F25B 49/02 62/190
2019/0128771 A1* 5/2019 Santarone ............ G02B 27/017
2019/0385115 A1* 12/2019 Biermann .............. G01K 1/024
2020/0072538 A1* 3/2020 Woolf .................. G05B 13/042
2020/0364381 A1* 11/2020 Wodrich ................. G01S 19/48
2021/0142271 A1 5/2021 Burch et al.
2021/0398059 A1* 12/2021 Gravelle ................. G06F 16/23
2022/0027842 A1* 1/2022 Brightwell ......... G06Q 10/0832
2022/0058299 A1 2/2022 Bellows et al.
2022/0296023 A1* 9/2022 Fernandez ........... A47G 29/141
2023/0012851 A1* 1/2023 Ho ..................... G06Q 10/0832
2023/0048341 A1* 2/2023 Alanqar ................... F24F 11/63
2023/0053605 A1* 2/2023 Santarone ................. G01S 3/46
2023/0176557 A1* 6/2023 Cella ................ G05B 19/41885 700/117
2023/0304869 A1* 9/2023 Laput ....................... G01K 3/04
2024/0426799 A1* 12/2024 Bolis ........................ G01K 7/42
2025/0298933 A1* 9/2025 Woolf ..................... G06F 30/18

* cited by examiner

TEMPERATURE-WEIGHTED UNIVERSAL NODE COORDINATION

INCORPORATION BY REFERENCE

This application claims the priority benefit of U.S. Provisional Patent Application No. 63/568,710, filed Mar. 22, 2024, the entirety of which is incorporated by reference herein.

TECHNICAL FIELD

This disclosure generally describes devices, systems, techniques, processes, and methods related to real-time monitoring of temperature throughout a facility for accurate and efficient temperature adjustment in different regions of the facility and item storage determinations.

BACKGROUND

A facility, such as a warehouse, cold storage facility, or other type of enclosure for maintaining items in storage, can store various types of items for various periods of time. The items can be delivered to the facility via freight vehicles (e.g., trucks, railcars, forklifts) and routed through the facility to one or more different locations. The locations can be designated for different tasks/operations, including but not limited to storage, depalletizing, palletizing, case packing, case picking, etc. The locations in the facility, such as the storage locations, can be maintained at different temperature values, those temperature values varying based on storage conditions/requirements of the items that are destined for those storage locations. Some of the storage locations can be freezer locations, or locations being maintained at designated freezer temperatures (e.g., 0° F.). Some of the storage locations can be cool locations being maintained at one or more temperatures that are within a threshold range above the freezer temperatures. Some of the storage locations can be maintained at ambient or other room temperatures. In some implementations, some of the storage locations can be maintained at temperatures that are below the designated freezer temperatures.

Sometimes, the storage locations can be maintained at certain temperature values, despite a total percentage of items being stored therein requiring such temperatures values (e.g., the storage location is maintained at −6° F. but only 10% of all items in that location require that temperature for storage). This can cause amounts of energy to be wasted in maintaining those storage locations at the less-than-desired temperature values. Sometimes, the facility itself may perform inconsistent identification of temperatures that the items need to be stored at, which may cause the items to be stored at temperatures that are not appropriate for those items and/or may cause greater consumption of energy for the facility to maintain storage locations at temperatures that are not actually required by the items stored therein.

SUMMARY

This document generally describes technology for real-time and accurate monitoring of temperature conditions throughout an entire 3D space of a facility, such as a warehouse or other storage facility/enclosure, which can be used to optimize identification of temperature levels and/or set points for different regions in the facility. The real-time monitoring of temperature conditions can be achieved by placing temperature sensors throughout the entire 3D space of the facility (e.g., along walls, around doors, close to a floor of the facility, close to a ceiling of the facility, on the ceiling), reading temperature values from those sensors, and processing those temperature values to accurately interpolate the temperature conditions in every cubic meter of the 3D space of the facility. The determined temperature conditions can be used to automatically control operations in the facility in a way that maintains consistency and reduces variability in efficient completion of facility operations. In some implementations, temperature sensors can be placed on hotspots and/or on facility vehicles, such as forklifts, to collect temperature readings that can be used to verify the temperature readings of the other temperature sensors in the facility. Placement of temperature sensors in the facility can depend on a particular architecture and/or layout of the facility. Computer-based modeling techniques may also be performed to determine X, Y, and Z locations for placement of the temperature sensors so that the placement of the sensors can be updated and/or changed in the facility. The modeling techniques may also be performed to determine a minimum quantity of temperature sensors that should be positioned in the facility while balancing sensor costs and temperature detection as well as interpolation accuracy. Once a temperature sensor design layout is tested and modeled in one facility, it can be extrapolated for use in other facilities.

The disclosed technology may further be used to optimize identification of appropriate storage conditions (e.g., storage temperatures) for items received at the facility and instructions for routing the items to storage locations in the facility that satisfy the identified storage conditions. Accordingly, the disclosed technology may allow for improved and efficient energy consumption in the facility, thereby reducing potential energy and/or food item waste. Potential energy waste can be reduced or otherwise eliminated because regions in the facility can be maintained at temperature values/levels that may actually be desired to safely store items therein. Potential food item waste can be reduced or otherwise eliminated because the items can be more appropriately and accurately matched with storage locations that are maintained at temperature values/levels that meet food safety criteria/conditions.

One or more embodiments described herein can include a system for determining sensor placement in a facility, the system including: one or more sensor devices positioned throughout the facility and a computer system that can be in communication, via a private communication network, with the one or more sensor devices. The computer system can receive temperature readings from the one or more sensor devices, model the temperature readings to determine actual temperature information for a three-dimensional (3D) space of the facility, determine whether the actual temperature information for the 3D space is trending within expected temperature levels for the facility, and based on the determination, generate output comprising modifications to a layout of the one or more sensor devices in the facility.

The system can optionally include one or more of the following features. For example, a portion of the one or more sensor devices can be attached to vehicles that move throughout the facility. Modeling the temperature readings can include applying a machine learning model to the temperature readings that was trained to interpolate the actual temperature information over each cubic meter of the facility. Modeling the temperature readings can include interpolating the actual temperature information for a portion of the 3D space of the facility. The portion of the 3D space of the facility can include less than a threshold portion of the one or more sensor devices. The computer system can also interpolate, based on applying a model to the actual temperature information for the 3D space, expected temperature conditions for a portion of the 3D space and compare the expected temperature conditions to the actual temperature information to determine whether the actual temperature information may be within the expected temperature levels.

Sometimes, generating the output further can include determining a smallest quantity of the one or more sensor devices needed in the facility to determine the actual temperature information for the 3D space of the facility. Generating the output further may include determining a quantity of the one or more sensor devices to affix to moving machines in the facility. Generating the output further may include determining a quantity of the one or more sensor devices to affix to stationary locations in the facility. Generating the output can include determining placement of the one or more sensor devices in one or more locations of the facility. Based on a determination that the actual temperature information for the 3D space trends within the expected temperature levels, the computer system can also generate a recommendation to reduce a total quantity of the one or more sensor devices that are positioned in the facility. In some implementations, the computer system can further be configured to: poll the one or more sensor devices for the temperature readings, receive, from a portion of the polled sensor devices, the temperature readings, determine whether the portion of the polled sensor devices are within threshold distances of each other, and based on a determination that the portion of the polled sensor devices are not within the threshold distances of each other, interpolate the actual temperature information between the portion of the polled sensor devices.

The computer system can also identify one or more regions as designated temperature zones in the facility based on the determination and return information about the designated temperature zones. Sometimes, generating the output can include applying a machine learning model to determine X, Y, Z placement of a portion of the one or more sensor devices in the facility. The computer system can generate pairs of designated locations in the facility and optimal sensor device positions based on applying a model to the temperature readings. The model can be trained to determine temperature differences between temperature readings from different sensor devices. The computer system can also learn a predictive model to approximate a map of the optimal sensor device positions based on the generated pairs. Sometimes, the computer system can generate an estimate of placement of the one or more sensor devices in undesignated locations in the facility based on applying the learned predictive model to the received temperature readings.

One or more embodiments described herein can include a system for classifying items and determining storage safety conditions for the items in a facility, the system including processors and memory storing instructions that, when executed by the processors, can cause the processors to perform a process that may include: receiving item information for an inbound item to the facility from one or more external data systems, determining an item classification for the inbound item based on applying a model to the item information, determining actual storage conditions for the inbound item based on the item classification, and returning information about the actual storage conditions for the inbound item.

The system can optionally include one or more of the following features. For example, the process can be performed before the inbound item arrives at the facility. The process can be performed once the inbound item arrives at the facility. The computer system can be in communication, via a private communication network, with the one or more external data systems. The item information can include textual descriptions of the inbound item. The item information can include expected storage conditions for the inbound item, and determining the actual storage conditions for the inbound item can include applying a model to the item classification and the expected storage conditions. The model can be trained to compare the expected storage conditions with information corresponding to the item classification to determine the actual storage conditions. Determining the item classification for the inbound item can include applying a model to the item information, the model can be trained to perform textual analysis and semantic analysis on textual item descriptions in the item information. The model can include artificial intelligence (AI). The model can be trained to determine the item classification for the inbound item based on identifying an item type in the textual item descriptions. The model can be trained to interpret the textual item descriptions to identify keywords that may correspond to characteristics of the inbound item. Sometimes, the process can include ranking the keywords from most accurate type of the inbound item to least accurate type of the inbound item. The model can also be trained to implement a semantic analysis algorithm to interpret a meaning in the textual item descriptions that indicates an item type.

Sometimes, the process can also include generating and returning output indicating the item classification for the inbound item. The output indicating the item classification for the inbound item can include a type of the inbound item. Determining the actual storage conditions for the inbound item can include applying a model to the item classification and the item information for the inbound item. Determining the actual storage conditions for the inbound item can include: identifying, based on the item classification, a type of commodity of the inbound item, and determining, based on the type of commodity of the inbound item, a range of acceptable storage conditions for the inbound item. The type of commodity can include seafood items and the range of acceptable storage conditions for the seafood items can be higher for food safety than other types of commodities. The type of commodity can include meat proteins and the range of acceptable storage conditions for the meat proteins can have an upper control limit of 5 degrees Fahrenheit. Sometimes, determining the actual storage conditions for the inbound item can include applying a model to the item classification and the item information for the inbound item, the model having been trained to determine a highest temperature that the inbound item can be stored at that can provide energy savings for the facility and that can ensure safety and quality of the inbound item. Determining the actual storage conditions for the inbound item can include applying a model that can be trained to determine the actual storage conditions based on a packaging used for the inbound item.

One or more embodiments described herein can include a system for determining storage information for items in a facility, the system including processors and memory storing instructions that, when executed by the processors, can cause the processors to perform a process that may include: receiving item information for inbound items to a facility, receiving real-time ambient conditions information for the facility, determining an item classification for each of the inbound items based on processing the respective item information, determining storage conditions for each of the inbound items based on the item classification for the respective inbound item and the real-time ambient conditions information, matching the inbound items to storage locations in the facility based on the determined storage conditions for each of the inbound items, and returning information based on the matching.

The system can optionally include one or more of the following features. For example, the item information can be received from a vehicle moving the inbound items to the facility. The item information can be received from a third party computer system or a warehouse management system (WMS). Determining the item classification for each of the inbound items can include applying a model to the respective item information, the model having been trained to determine the item classification based on performing textual analysis on item descriptions in the item information. Determining the storage conditions for each of the inbound items can include applying a model to the item classification and the real-time ambient conditions information, the model having been trained to determine the storage conditions for each item classification type that may satisfy one or more threshold safety criteria corresponding to the item classification type. The real-time ambient conditions information can be received from a WMS. The real-time ambient conditions information can be received from one or more sensor devices positioned throughout the facility. A portion of the one or more sensor devices can be attached to moving machines in the facility that can capture the real-time ambient conditions information as the moving machines move in the facility.

Sometimes, the process can include grouping one or more of the inbound items having respective storage location matches that satisfy one or more grouping criteria, generating instructions for routing the grouped inbound items to a storage location amongst the respective storage location matches, and returning the instructions for automated execution by moving machines in the facility. Returning information based on the matching can include generating instructions for routing each of the inbound items to the respective matched storage location. The real-time ambient conditions information can include temperature readings that can be captured by sensor devices positioned throughout the facility. The real-time ambient conditions information can be determined by the computer system in a process that may include: receiving sensor data from sensor devices positioned throughout the facility, determining temperature information for one or more locations in the facility based on processing the sensor data, the one or more locations including the storage locations, and interpolating the determined temperature information to generate the real-time ambient conditions information. Interpolating the determined temperature information can include: retrieving a model that could have been trained using historic facility data to interpolate ambient conditions across a 3D space of the facility based on the temperature information, and applying the model to the real-time temperature information to generate the real-time ambient conditions information. Determining the storage conditions for each of the inbound items can include modeling the storage conditions for the inbound item based on packaging characteristics of the inbound item. The packaging characteristics can include a type of packaging. The packaging characteristics can include a size or dimensions of the packaging. In some implementations, the process can also include: based on matching the inbound items to the storage locations in the facility, generating instructions to cause automated machines in the facility to route the inbound items from respective current locations to the matched storage locations in the facility and returning the instructions to the automated machines, wherein the automated machines are configured to execute the instructions automatically. The process may also include determining recommendations to separate a storage location in the facility into separate temperature zones and assigning the groups to the separate temperature zones. Determining the item classification for each of the inbound items can include applying AI that could have been trained to determine a type of the inbound item based on processing the item information. The matching can include performing a grouping algorithm to match an item type of each of the inbound items to a storage location amongst the storage locations such that a storage temperature of the storage location can be less than a maximum storage temperature of any item in the storage location.

One or more embodiments described herein can include a system for interpolating ambient conditions across a facility, the system including sensor devices that can be configured to generate sensor data indicating ambient conditions in a facility, where a first portion of the sensor devices can be positioned in different locations of the facility and a second portion of the sensor devices can be attached to vehicles that move amongst the different locations of the facility, and a computer system in data communication with the sensor devices. The computer system can perform a process that may include: receiving the sensor data from the sensor devices, determining real-time temperature information for the different locations of the facility based on processing the sensor data, interpolating the real-time temperature information to determine real-time temperature information for the facility, and returning the real-time temperature information for the facility.

The system can optionally include one or more of the following features. For example, interpolating the real-time temperature information can include applying a model that could have been trained using historic facility data to interpolate ambient conditions across the facility. The process can also include: determining whether the real-time temperature information for the facility is within expected threshold levels for the facility, based on a determination that the real-time temperature information for the facility is not within the expected threshold levels, generating component controls for adjusting the ambient conditions in one or more of the different locations of the facility, and returning the component controls to facility components for automated execution. The facility components can include a refrigeration system. The facility components can include fans. Based on a determination that the real-time temperature information for the facility is not within the expected threshold levels, the process further can include generating recommendations for modifying a layout of the facility, the recommendations including designating the one or more of the different locations of the facility as a different location type. The location type can include at least one of a storage room, a freezer room, and a cold storage room.

Sometimes, based on a determination that the real-time temperature information for the facility is not within the expected threshold levels, the process further can include generating recommendations indicating placement and quantity of the first portion of the sensor devices in the different locations of the facility. Based on a determination that the real-time temperature information for the facility is within the expected threshold levels, the process further can include returning the real-time temperature information for the facility for use in identifying storage conditions and instructions for storing one or more items in the facility. The process may also include: receiving item information for the one or more items, determining, for each of the items, an item classification based on processing the item information, determining, based on the item classification for each item and the real-time temperature information for the facility, actual storage conditions for the item, matching, for each of the items, the item to a storage location amongst the different locations in the facility based on the actual storage conditions for the item, and returning information for routing each of the one or more items to the respective matched storage location in the facility. Receiving the sensor data from the sensor devices can include polling the first portion of the sensor devices for respective temperature and location data. In yet some implementations, determining the real-time temperature information for the different locations of the facility can include: determining X,Y,Z coordinates of each of the first portion of the sensor devices based on the respective location data and for each of the first portion of the sensor devices, triangulating (i) the temperature data from sensor devices amongst the first portion of the sensor devices and (ii) the sensor data from sensor devices amongst the second portion of the sensor devices that may be within a threshold distance from the determined X,Y,Z coordinates. Sometimes, determining the real-time temperature information can include applying a model that could have been trained to (i) model expected movement between doorways and entrances that can be positioned between one or more of the different locations of the facility, and (ii) identify changes in the ambient conditions in the one or more of the different locations of the facility based on the expected movement between the doorways and the entrances. The different locations of the facility can include one or more locations corresponding to different temperature zones. The sensor devices can include temperature sensors. The ambient conditions can include temperature readings in the facility. The ambient conditions can include at least one of temperature readings, pressure readings, and humidity readings in the facility. The vehicles can include forklifts. Sometimes, the vehicles can include automated moving machines.

One or more embodiments described herein can include a system for controlling components in a facility to improve energy efficiency and consumption in the facility, the system including sensor devices positioned throughout the facility, facility components that can be configured to be automatically controlled to perform operations in the facility, and a computer system that can be in communication, via a private communication network, with the sensor devices and the facility components. The computer system can perform a process that may include: receiving temperature readings from the one or more sensor devices, modeling the temperature readings to determine actual temperature information for the facility, determining whether the actual temperature information for the facility is trending within expected temperature levels for the facility, based on the determination, generating instructions for controlling the facility components, and returning the instructions, which can cause the facility components to be automatically controlled according to the instructions.

The system can optionally include one or more of the following features. For example, generating the instructions for controlling the facility components can be further based on storage conditions of at least one of inbound items and items currently in storage at the facility. The facility components can include a refrigeration system in the facility, and the instructions for controlling the facility components can include instructions to activate or deactivate the refrigeration system for a predetermined period of time. The facility components can include a group of refrigeration systems, where each of the group of refrigeration systems can be configured to adjust temperature conditions at a different location in the facility. In response to (i) the actual temperature information for a portion of the facility trending below the expected temperature levels for the facility and (ii) a quantity of items being stored in the portion of the facility having an actual storage temperature that exceeds the expected temperature levels for the facility, the process can also include generating instructions that can cause a refrigeration system to reduce a cool air supply to a corresponding portion of the facility for a predetermined period of time. The process can also include generating a recommendation to reduce a square footage of the portion of the facility to a size that may be suitable for storing the quantity of items.

Sometimes, the process further can include generating, based on the actual temperature information for the facility, instructions to cause a portion of the facility to be cooled to a temperature below a threshold level and to cause another portion of the facility to be cooled to a temperature that trends within the expected temperature levels for the facility. Generating the instructions can include generating instructions to control a speed of a fan in a portion of the facility that can correspond to the actual temperature information that can trend outside of the expected temperature levels for the facility. The instructions to control the speed of the fan can also include instructions to increase the speed for a predetermined period of time to cause the portion of the facility to decrease to a temperature within an expected temperature level associated with the portion of the facility. Sometimes, the instructions to control the speed of the fan can include instructions to intermittently activate and deactivate the fan at varying speeds over a predetermined period of time to cause the portion of the facility to maintain a temperature within the expected temperature level associated with the portion of the facility. Based on determining whether the actual temperature information for the facility is trending within expected temperature levels for the facility, the process can also include mapping causality between evaporators turning on in the facility and portions of the facility that change in temperature. Sometimes, the mapping can be performed using a neural network, and the process further can include: determining x,y,z locations of the portions of the facility having respective actual temperature information trending outside of the expected temperature levels for the facility, and providing the x,y,z locations as inputs to the neural network. The neural network could have been trained to generate output indicating one or more of the evaporators to turn on and for how long to return the portions of the facility to trend within the expected temperature levels for the facility. Sometimes, generating the instructions can include generating instructions to deactivate a refrigeration system operating for a portion of the facility to cause the portion of the facility to warm up to a temperature within an expected temperature range for safe storage of a group of items. The group of items can include items of different types. The items of the different types can include storage temperature conditions that can be within a threshold range of each other. Generating the instructions can include generating instructions to activate a refrigeration system operating for a portion of the facility to cause the portion of the facility to decrease to a threshold freezing storage temperature for safe storage of a group of items. The group of items can include items of different types. Returning the instructions can include executing the instructions by the computer system to automatically control the facility components. Returning the instructions can include transmitting the instructions to respective facility component controllers. The facility component controllers can be configured to automatically execute the instructions to control operations of the respective facility components.

One or more embodiments described herein can include a system for interpolating ambient conditions across a facility, the system including: a group of sensors that can be configured to generate sensor data indicating ambient conditions in a facility, a first portion of the group of sensors being configured to be positioned in different locations of the facility, a second portion of the group of sensors being configured to be attached to facility vehicles and moved throughout the facility as the facility vehicles move amongst the different locations of the facility, and a computer system in data communication with the group of sensors. The computer system can be configured to perform a process including: receiving the sensor data from the group of sensors, determining real-time temperature information for the different locations of the facility based on processing the received sensor data, retrieving a machine learning model that was trained using historic facility data to interpolate ambient conditions across a three-dimensional (3D) space of the facility using temperature information that corresponds to a portion of the 3D space of the facility, applying the machine learning model to the real-time temperature information for the different locations of the facility, determining, based on applying the machine learning model, real-time temperature information for the entire 3D space of the facility, and returning the real-time temperature information for the entire 3D space of the facility.

In some implementations, the embodiments described herein can optionally include one or more of the following features. For example, the process can also include determining whether the real-time temperature information for the entire 3D space of the facility may be within expected threshold levels for the entire 3D space of the facility, based on determining that the real-time temperature information for the entire 3D space of the facility is not within the expected threshold levels, generating component controls for adjusting the ambient conditions in one or more of the different locations of the facility, and returning the component controls to one or more facility components for execution. The facility components can include a refrigeration system. The facility components can include one or more fans. The process can also include, based on determining that the real-time temperature information for the entire 3D space of the facility is not within the expected threshold levels, generating one or more recommendations for modifying a layout of the facility, the recommendations for modifying the layout of the facility including designating the one or more of the different locations of the facility as a different location type. The location type can include at least one of a storage room, a freezer room, or a cold storage room. The process may also include, based on determining that the real-time temperature information for the entire 3D space of the facility is not within the expected threshold levels, generating one or more recommendations indicating placement and quantity of the first portion of the group of sensors in the different locations of the facility.

Sometimes, the process can also include, based on determining that the real-time temperature information for the entire 3D space of the facility is within the expected threshold levels, returning the real-time temperature information for the entire 3D space of the facility for use in identifying storage conditions and instructions for storing one or more items in the facility. The process may also include: receiving item information for the one or more items, determining, for each of the items, an item classification based on processing the item information, determining, based on the item classification for each item and the real-time temperature information for the entire 3D space of the facility, actual storage conditions for the item, matching, for each of the items, the item to a storage location amongst the different locations in the facility based on the actual storage conditions for the item, and returning information for routing each of the items to the respective matched storage location in the In some implementations, receiving the sensor data from the group of sensors can include polling the first portion of the group of sensors for respective temperature and location data. Determining real-time temperature information for the different locations of the facility based on processing the received sensor data can include: determining X, Y, and Z coordinates of each of the first portion of the group of sensors based on the respective location data, and, for each of the first portion of the group of sensors, triangulating (i) the temperature data from sensors amongst the first portion of the group of sensors and (ii) the sensor data from sensors amongst the second portion of the group of sensors that may be within a threshold distance from the determined X, Y, and Z coordinates. Sometimes, applying the machine learning model to the real-time temperature information for the different locations of the facility can include: modeling expected movement between doorways and entrances that may be positioned between one or more of the different locations of the facility, and identifying changes in the ambient conditions in the one or more of the different locations of the facility based on the expected movement between the doorways and the entrances. The different locations of the facility can include one or more storage rooms, freezer rooms, and cold storage rooms. The group of sensors may include temperature sensors. The ambient conditions may include temperature readings in the facility. The ambient conditions can include at least one of temperature readings, pressure readings, or humidity readings in the facility.

One or more embodiments described herein can include a system for determining storage information for items in a facility, the system including: a computer system that can be configured to perform operations including: receiving item information for inbound items to a facility, the item information being received from at least one of freight vehicle moving the inbound items to the facility, a third party computer system, or a warehouse management system (WMS), determining an item classification for each of the inbound items based on processing the respective item information with a first machine learning model, the first machine learning model having been trained to determine the item classification based on performing textual analysis on item descriptions in the item information, determining storage conditions for each of the inbound items based on applying a second machine learning model to the item classification for the respective inbound item and real-time ambient conditions information for the facility, the second machine learning model having been trained to determine storage conditions for each item classification type that satisfy one or more threshold safety and quality criteria corresponding to the item classification type, matching the inbound items to storage locations in the facility based on the determined storage conditions for each of the inbound items, and returning information based on the matching.

The system can optionally include one or more of the following features. The operations can also include: grouping one or more of the inbound items having respective storage location matches that satisfy one or more grouping criteria, generating instructions for routing the grouped inbound items to a storage location amongst the respective storage location matches, and returning the instructions. Returning information based on the matching can include generating instructions for routing each of the inbound items to the respective matched storage location. The real-time ambient conditions information for the facility can be determined by the computer system in a process that may include: receiving sensor data from a group of sensors positioned throughout the facility, determining real-time temperature information for one or more different locations of the facility based on processing the received sensor data, the one or more different locations including the storage locations, retrieving a third machine learning model that could have been trained using historic facility data to interpolate ambient conditions across a three-dimensional (3D) space of the facility using temperature information that may correspond to a portion of the 3D space of the facility, applying the third machine learning model to the real-time temperature information for the different locations of the facility, and determining, based on applying the third machine learning model, the real-time ambient conditions information for the entire 3D space of the facility. Determining storage conditions for each of the inbound items based on applying a second machine learning model to the item classification for the respective inbound item and real-time ambient conditions information for the facility can also include: modeling the storage conditions for the inbound item based on packaging characteristics for the inbound item. The packaging characteristics can include a type of packaging. The packaging characteristics can include a size or dimensions of the packaging.

One or more embodiments described herein can include a system for determining ambient conditions and item storage information in a facility, the system including: a group of sensors that can be configured to generate sensor data indicating ambient conditions in different locations of a facility, and a computer system in data communication with at least the group of sensors, the computer system being configured to perform a process that may include: receiving the sensor data from the group of sensors, determining real-time temperature information for an entire three-dimensional (3D) space of the facility based on applying a first machine learning model to the received sensor data, the first machine learning model having been trained to interpolate ambient conditions across a 3D space of a facility using temperature information that may correspond to a portion of the 3D space of the facility, receiving item information for inbound items, the item information being received from at least one of freight vehicle moving the inbound items to the facility, a third party computer system, or a warehouse management system (WMS), determining an item classification for each of the inbound items based on processing the respective item information with a second machine learning model, the second machine learning model having been trained to determine the item classification based on performing textual analysis on item descriptions in the item information, determining storage conditions for each of the inbound items based on applying a third machine learning model to the item classification for the respective inbound item and real-time ambient conditions information for the facility, the third machine learning model having trained to determine storage conditions for each item classification type that may satisfy one or more threshold safety and quality criteria corresponding to the item classification type, and returning information associated with at least one of the real-time temperature information for the entire 3D space of the facility or the determined storage conditions for each of the inbound items.

The system can optionally include one or more of the following features. For example, a first portion of the group of sensors can be configured to be positioned in the different locations of the facility, a second portion of the plurality of sensors can be configured to be attached to facility vehicles and moved throughout the facility as the facility vehicles move amongst the different locations of the facility. Determining real-time temperature information for an entire three-dimensional (3D) space of the facility based on applying a first machine learning model to the received sensor data may include: determining real-time temperature information for the different locations of the facility based on processing the received sensor data, retrieving the first machine learning model from a data store, applying the first machine learning model to the real-time temperature information for the different locations of the facility, and determining, based on applying the machine learning model, the real-time temperature information for the entire 3D space of the facility. The process may also include matching the inbound items to storage locations in the facility based on the determined storage conditions for each of the inbound items, and returning information based on the matching.

The devices, system, and techniques described herein may provide one or more of the following advantages. For example, accurate, real-time temperature monitoring of every square or cubic meter of the 3D space of the facility can be used reactively to determine how to save energy costs in the facility. The disclosed technology can also be used prescriptively to save on energy costs. A control system in the facility can use temperature values and conditions described herein to maintain consistency and reduce variability in energy costs/usage for the overall facility. The disclosed technology may also provide for consistent performance (in detecting and monitoring real-time temperature conditions) in austere operating environments such as cold storage. A combination of temperature sensors and computer-based modeling techniques for temperature interpolations can enable high precision and accurate spatial measurements for the facility. Accordingly, such high precision and accurate special measurements can be used in combination with computer modeling techniques to estimate efficient energy usage temperature conditions for which to operate the facility at while also ensuring that food items and other items are maintained at safe temperature conditions while in the facility.

Advantageously, the disclosed technology may be deployed on a private cellular network, which may offer advantages over public cellular networks. For example, the private cellular network can allow for temperature sensor data to remain localized rather than being transmitted over the internet or other public networks, thereby ensuring secure and undisrupted transmission of facility-related data. This configuration may also allow for seamless integration of components and/or control systems in the facility. Scalability of the private network can provide improved operational facilities for the facility. Since this network can be frequency controlled, it may not become congested nor experience performance degradation in high-density environments, or when dealing with a large numbers of devices. This private cellular network therefore can handle massive deployments with many connected devices. The scalability of such a network can allow for seamless integration of new devices and applications, including Internet of Things (IoT) deployments. The disclosed network may also enable persistent connections supporting data collection, transmission, and automation, massive sensor deployment, expanded access for broader use, support for thermal collection devices mounted on forklifts or other facility vehicles moving throughout regions of the facility, consistent performance in austere operating environments (cold storage), prioritization of user access/bandwidth allocation based on user rules, high precision spatial measurement, elimination of rogue access to allocate bandwidth to authorize users, and secure data at rest/transmission from potentially malicious users.

Similarly, the disclosed technology can provide reliable, interference-free wireless connectivity for persistent, consistent thermal monitoring. The disclosed technology can enable temperature sensing (e.g., thermal) devices with a high degree of spatial/temporal accuracy to produce and/or collect environmental temperature data on a persistent, periodic basis. The disclosed technology further may make transportation of sensor data safe, reliable, consistent, and fact to various components, control systems, and/or data analytics engines in near real-time and/or real-time. Furthermore, the disclosed technology can provide seamless and stable transmission of thermal monitoring adjustment commands from the components, control systems, and/or data analytics engines to thermal control devices and/or temperature sensing devices throughout the facility.

Moreover, the disclosed technology provides technical improvements to technical problems associated with conventional temperature monitoring systems. For example, interpolation using machine learning models allows for accurately estimating temperature values at unmeasured locations and/or times. This is especially important when there is sparse or missing sensor data. The models described herein can learn spatial and temporal dynamics of the temperature, allowing it to predict conditions in locations that may be difficult to measure (e.g., areas with poor sensor coverage or irregular sensor placement). By filing in the gaps based on observed patterns in the available data, the disclosed technology can generate more accurate and continuous temperature readings across a facility than the conventional systems. Machine learning-based interpolation not only enhances accuracy of the data but also enables the detection of anomalies or outliers. For instance, if a sensor's data deviates significantly from the model's predictions, this could indicate a malfunctioning sensor or a developing issue in the facility's environmental controls, which can cause the disclosed technology to accurately determine and recommend ways in which to modify a layout of the facility, sensor placement in the facility, and/or controls of components within the facility, which is not possible with the conventional systems. The disclosed technology can also predict temperature trends, which can be used to optimize (heating, ventilation, and air conditioning) systems, energy consumption, and improve predictive maintenance schedules for the components within the facility. With more accurate and interpolated temperature data, the disclosed technology can also act in real-time. For example, the disclosed technology can trigger automated adjustments in heating or cooling when temperature inconsistencies are identified, ensuring better control of the facility's environment. Accordingly, improved predictions of temperature patterns enable the disclosed technology to operate more efficiently, which can lead to reduced energy costs and improved resource allocation.

The disclosed technology can also provide technical improvements in that the described machine learning models can be trained to interpolate temperature data by combining temperature data from multiple sensors, compensating for sparse data, and/or using specific types of machine learning (e.g., deep learning, recurrent neural networks), all of which is not possible with the existing temperature monitoring systems. The disclosed technology's ability to improve temperature control in a facility in ways that were previously inefficient or impractical provides technical improvements over the existing systems.

As another example, the disclosed models, especially those used for interpolation of temperature data, involve complex mathematical computations, algorithms, and statistical techniques that require significant computational power and therefore cannot be reasonably performed in the human mind. The process of training said models on large datasets, which may include historical temperature data, sensor readings, time stamps, involves multiple iterations of adjusting weights, calculating errors, and optimizing model parameters in real-time or near real-time. Humans cannot mentally replicate this iterative, data-driven process, which relies on accurately performing significant numerical computations in little time. Moreover, predicting temperature distribution based on current sensor readings and historical trends also involves large-scale data manipulation and forecasting, which is a process that exceeds the human mind's capability to execute manually. Forecasting, especially using models such as those described herein, requires a level of precision and computational complexity that humans cannot simulate mentally. Similarly, humans are not capable of mentally computing temperature variations across large areas (such as multiple rooms or floors in a facility) while considering various environmental factors (e.g., airflow, heat sources, temperature of inventory/products/items). The kind of spatial interpolation used in machine learning and described herein involves mathematical formulas and vector spaces that are beyond human cognitive abilities to perform manually. As described herein, the disclosed technology can also perform interpolation and generate predictions automatically on a scale and in real-time that may not be possible for humans to replicate. For example, the disclosed technology can continuously gather data from hundreds of sensor devices, interpolate missing values, and adjust control systems without human intervention, all while taking into account changing environmental conditions.

The details of one or more implementations are set forth in the accompanying drawings and the description below. Other features and advantages will be apparent from the description and drawings, and from the claims.

In the present disclosure, like-numbered components of various embodiments generally have similar features when those components are of a similar nature and/or serve a similar purpose, unless otherwise noted or otherwise understood by a person skilled in the art.

DETAILED DESCRIPTION OF ILLUSTRATIVE EMBODIMENTS

This disclosure generally relates to technology for real-time monitoring of temperature conditions in a facility, adjusting facility operations and/or layouts and/or sensor devices placement in the facility based on the temperature monitoring, and determining optimal storage conditions for different items in the facility based on the monitoring, operations, and/or layouts of the facility. The disclosed technology can enable a safe increase in freezer storage temperatures by varying degrees (such as +5° F. and/or −15° C. in some implementations) by persistently monitoring, modeling, and interpolating freezer temperatures in real-time. The disclosed technology can also be used for real-time monitoring and adjusting of temperature conditions in other enclosed spaces, including but not limited to rooms, trucks, boats or ships, and/or other enclosures, to ensure safe storage temperatures for different types of products and/or commodities. Temperature readings from the sensor devices positioned throughout the facility can be transmitted over a private cellular network or other private communication network, which can enable a dense array of sensors and devices to communicate and also collect/transmit precise data to control systems, other facility components, and/or data analytics engines.

The private cellular network can support various quantities of sensor devices, such as temperature sensors. In some implementations, the network may support an exemplary 350 temperature sensors. The traffic from these sensors can be aggregated onto one or more gateway devices (e.g., 6 gateway devices), and the data transmitted by the sensors can provide an actionable temperature gradient map of the facility. Sometimes, the sensors can provide temperature readings for only some locations in the facility. Computer modeling techniques can be applied to the temperature sensor readings to interpolate temperature conditions across every square or cubic meter of the entire facility.

The disclosed technology can also leverage computer modeling techniques to determine optimal storage conditions for items in the facility. Endpoint freezing in the facility can be targeted to particular types of items being frozen, with primary drivers being commodity, packaging, and/or size of package for those items. The disclosed technology can be used to determine the optimal storage conditions for many types of items, including but not limited to protein commodities, bulk juice concentrates, and/or bulk fruits.

Figure 1:
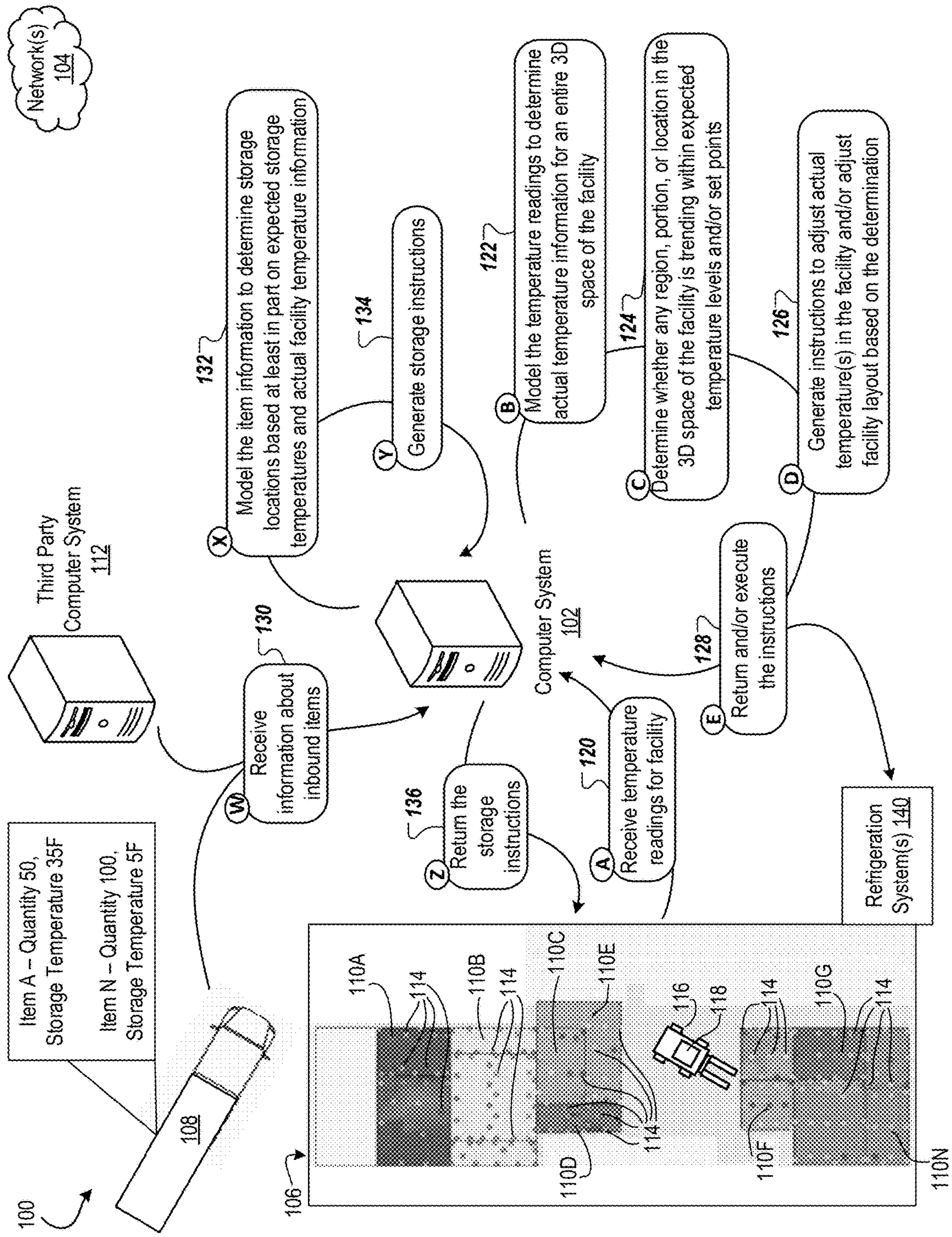
FIG. 1 is a conceptual diagram of a system for determining storage locations for inbound items in a facility based on analysis of item information and real-time temperature readings in the facility.

Referring to the figures, FIG. 1 is a conceptual diagram of a system 100 for determining storage locations for inbound items A-N in a facility 106 based on analysis of item information and real-time temperature readings in the facility 106. FIG. 1 illustrates two processes that can be performed, simultaneously, consecutively, and/or at different times. Blocks A-E (120-128) represent a first process in determining real-time and accurate temperature conditions in every square meter of the facility 106 and modifying operations and/or other factors about the facility 106 based on those real-time temperature conditions. The real-time temperature modeling can be used to recommend and/or perform reactive and prescriptive operations in the facility 106 that can save on energy costs. Blocks W-Z (130-136) represent a second process for using the real-time temperature conditions to identify storage locations and conditions for the inbound items A-N. The storage locations and storage conditions can be determined in such a way that saves on energy costs while also ensuring food item safety and quality.

The system 100 of FIG. 1 can include a computer system 102, the facility 106, a freight vehicle 108, and a third party computer system 112. In brief, the computer system 102 can be a controller and/or any type of computing device, network of computing systems, and/or cloud-based system. The computer system 102 can be configured to perform operations described herein, including but not limited to real-time monitoring of temperature conditions in the facility 106, determining facility operational modifications based on the monitoring, and/or storage instructions for items A-N. The freight vehicle 108 can be any type of vehicle, truck, car, boat, railcar, autonomous vehicle, etc., that may be used and configured to transport the items A-N to and from the facility 106 and between various components of a relevant supply chain. The third party computer system 112 can be any type of computing device, network of computing systems, and/or cloud-based system configured to communicate information with the facility 106 about the items A-N to be stored in the facility 106. In some implementations, the third party computer system 112 may be associated with the facility 106. The system 112 can be, for example, a facility management system, a warehouse management system (WMS), a delivery computer system, etc.

The facility 106 may include a plurality of locations 110A-N, each of which may be used for different operations/tasks in the facility 106. Some of the locations 110A-N can include storage locations. The locations 110A-N can have different temperature conditions and other storage conditions. For example, one or more of the locations 110A-N can be maintained at different temperature values and/or levels. One or more of the locations 110A-N can include freezers, cool storage locations, and/or ambient/room-temperature storage locations.

Sensor devices 114 can be placed throughout the facility 106, such as in one or more of the locations 110A-N. The sensor devices 114 can include temperature sensors configured to collect temperature readings throughout the facility 106. The sensor devices 114 can be arranged throughout the facility 106 according to the facility layout and other facility-specific factors. Sometimes, more sensors 114 can be positioned around doors or other entryways between locations 110A-N having differing temperature conditions or other storage conditions. Sometimes sensors 114 can be positioned closer to a ceiling of the facility 106, closer to a floor of the facility 106, on the ceiling, etc.

The facility 106 may also include one or more refrigeration systems 140. The refrigeration system(s) 140 can be configured to provide cooled air and/or refrigeration to one or more of the locations 110A-N in the facility 106. Sometimes, each location 110A-N in the facility 106 can have a respective refrigeration system 140. Sometimes, each refrigeration system 140 can service multiple locations 110A-N.

One or more facility vehicles 118 can be configured to move around the facility 106 and perform operations/tasks therein. The facility vehicle(s) 118 can include, but is not limited to, forklifts, autonomous vehicles, autonomous guided vehicles (AGVs), robots, cranes, or other item/pallet movers. In some implementations, one or more sensor devices 118 can be mounted onto or otherwise attached to the vehicle(s) 116. For example, the vehicle 116 can be a forklift and can have at least one temperature sensor or other thermal sensing device attached thereto. As the vehicle 116 moves throughout the facility 106 (e.g., from one temperature-controlled location to another), the sensor device(s) 118 can capture temperature readings.

The sensor devices 118 placed on the vehicle(s) 116 can be used in addition to selectively placed stationary wireless sensor devices 114, which monitor hotspots and/or other areas in the facility 106 that may or may not be sampled by the vehicle(s) 116 traversing the facility 106. The sensor placement strategy may not be a traditional grid, but rather an-iterative method called time-dependent Kriging (TDK), or time-dependent Gaussian Process Regression Machine Learning, in conjunction with data from previously measured rooms or locations in the facility 106. As a result, error measurements from topologically similar rooms can be leveraged, thereby allowing for one-time placement of sensors, which can minimize a total number of sensors needed in a particular room or location or the facility 106 as a whole. TDK can also provide an optimal sensor placement such that an error at any non-sensored location may not exceed an error threshold & at any time t. Precise temperature control can also be facilitated by a model predictive controls (MPC) algorithm that can be executed by the computer system 102 described herein.

The computer system 102, the third party computer system 112, the freight vehicle 108, and the sensor devices 114 in the facility 106 can communicate (e.g., wired, wirelessly) via network(s) 104. The network(s) 104 can be a private cellular network (e.g., 5G network). The network(s) 104 can provide wireless connectivity for temperature sensing devices in the facility 106 with a high degree of spatial and temporal accuracy in an interference-free radio environment. The network(s) 104 can provide for fast and efficient communication amongst system components in the facility 106.

The disclosed network(s) 104 can facilitate in providing numerous advantages for the facility 106 to safely increase freezer storage temperatures to temperature values, set points, levels, and/or ranges that can translate to significant reductions in energy costs for freezer spaces in the facility. As an illustrative example, increasing freezer storage temperatures +5° F. can cause approximately 20% reduction in energy costs for the freezer spaces. The network(s) 104 may have capacity to support massive device densities, such as any quantity of sensor devices positioned throughout the facility 106 as well as sensor devices being moved throughout the facility 106 by vehicles, such as forklifts. Since the network(s) 104 may operate within a particular spectrum band, it can be interference-free. Moreover, the network(s) 104 can provide improved performance with higher bandwidth throughput for a large number of actively connected devices in the facility 106. For example, the network(s) 104 can be capable of provisioning bandwidth per application and/or per device connected to the network. The network(s) 104 can experience low latency and make it rather easy to integrate into existing facilities without requiring an entirely new network to be set up. The network(s) 104 can sometimes include improved security by leveraging a zero trust architecture, which can require a SIM card or eSIM and provisioning, rather than a distributed password for all the connecting devices.

Moreover, the network(s) 104 can integrate existing operational technology such as mobile devices and sensors currently used in the facility 106, but may also support new devices, sensors, and operational capabilities in ways that supplement existing Wi-Fi capabilities and infrastructure and/or replace them upon receipt of authority to operate. Network(s) 104 can also provide coverage for native cellular devices, spectrum for new devices, connectivity solutions to bridge non-cellular devices, and backhaul dedicated to one or more networks that may be separate from the facility 106's existing operational network infrastructure.

In some implementations, the network(s) 104 leverage cloud-based technology for a core network (e.g., software-defined networking) to support multiple sites and can allow for dynamic sizing to support quick demand. The cloud-based deployment can improve latency and can have redundancy built into the cloud-based infrastructure. Leveraging the cloud architecture can allow for rapid deployment of a standard architecture across the facility 106. The deployment can occur without interfering with existing operational networks. A private cellular network can be implemented so that it coexists seamlessly with existing wireless/wired networks, augments current operations, and allows for services to be added in parallel with existing technology so as not to disrupt ongoing operations.

Still referring to the system 100 of FIG. 1, the computer system 102 can receive temperature readings for the facility 106 from one or more of the sensor devices 114 in the locations 110A-N of the facility 106 and/or the sensor devices 118 attached to the facility vehicles 116 (block A, 120). The temperature readings can include coordinate readings, including but not limited to (time, x, y, z). The network(s) 104 described herein can provide seamless, real-time, and/or near real-time collection of temperature data. The temperature readings can be collected continuously throughout a day. The temperature readings can be collected at predetermined time intervals. Sometimes, the temperature readings can be collected at different times based on the designated locations 110A-N in the facility 106 and/or operations/tasks being performed in the facility 106. As an illustrative example, temperature readings may be collected from one or more of the sensor devices 114 in and around the location 110F as the vehicle 116 approaches the location 110F, enters the location 110F, and/or leaves the location 110F. During this time period, temperature readings from or near other locations, such as the location 110A and/or 110N, may not be collected, or may be collected but not transmitted to the computer system 102 in block A (120).

The computer system 102 can model the temperature readings to determine actual temperature information for an entire 3D space of the facility 106 (block B, 122). As described further in reference to at least FIGS. 2 and 5, the computer system 102 can retrieve one or more machine learning models from a data store and/or local memory of the computer system 102. The model(s) can be trained using machine learning techniques to interpolate temperature information (e.g., temperature conditions) over every cubic meter of the facility 106, regardless of how many sensor devices 114 and 118 are located in the facility 106 and regardless of an arrangement of those sensor devices 114 and 118. In block B (122), the trained model can be used at runtime to interpolate the temperature conditions throughout the entire 3D space of the facility 106. Sometimes, the model can be used to selectively determine/interpolate temperature conditions in one or more regions of the 3D space of the facility 106, but not the entire 3D space and/or not all of the locations 110A-N.

The computer system 102 may also determine whether any region/portion and/or location 110A-N of the 3D space of the facility 106 is trending within expected temperature levels and/or set point values (block C, 124). The computer system 102 can retrieve information for the facility 106 layout from the data store or local memory of the computer system 102. The retrieved information can include expected temperature ranges, levels, and/or set points for each location 110A-N in the facility 106. The retrieved information may also include expected temperature ranges, levels, and/or set points for the entire 3D space of the facility 106, including but not limited to an overall temperature for maintaining the facility 106. In block C (124), the computer system 102 may compare interpolated temperature conditions from block B (122) against the expected temperature conditions for a region, portion, and/or location 110A-N in the facility 106 associated with the interpolated temperature conditions. In some implementations, the computer system 102 can use similar modeling techniques as described above to interpolate expected temperature conditions in a region and/or portion of the 3D space for which the computer system 102 interpolated actual/real-time temperature conditions in block B (122). This may occur when the retrieved expected temperature conditions only correspond to designated locations 110A-N in the facility 106, but not more obscure areas or portions of the facility 106, such as a ceiling in one or more hallways and/or corners in unused rooms or offices or other non-storage locations (e.g., less-frequented areas or portions of the facility). The interpolated expected temperature conditions may then be compared against the interpolated actual temperature conditions in block C (124). Sometimes, the model can make the determination of block C (124) and return determination results as output.

The computer system 102 can generate instructions to adjust one or more actual temperatures in the facility 106 and/or adjust a layout for the facility 106 in block D (126) and based on the determination in block C (124). Sometimes, the operations performed in block D (126) can be based on expected storage conditions of items at the facility 106, including but not limited to inbound items, items currently in the facility 106, items currently in storage, etc. (refer to at least block X, 132, and FIGS. 3-4). In brief, the computer system 102 can generate controls that cause one or more of the refrigeration systems 140 of the facility 106 to activate, deactivate, and/or readjust based on one or more temperature conditions in any region, portion, or location 110A-N in the facility 106 trending outside the respective, expected temperature conditions.

The computer system 102 may recommend modifying a layout of the facility 106 that may result in energy cost savings for the facility 106 as a whole. For example, the computer system 102 may determine that a quantity of items less than a threshold quantity requires storage in temperature conditions below a freezing temperature threshold. The location 110A in the facility 106 may be maintained at a suitable temperature for those items' storage that is below the freezing temperature threshold, however the location 110A may have more space (e.g., racks, aisles, storage locations) than needed to store the quantity of items. Therefore, the computer system 102 can generate a recommendation to reduce a square footage of the location 110A to a size that is suitable for storing the quantity of items. As a result, less energy can be consumed to cool the reduced-sized location 110A than if the location 110A remained at its original size.

The computer system 102 may recommend modifying placement of the sensor devices 114 throughout the facility 106. The recommendations can be made using one or more of the machine learning models described herein. This determination may depend on accuracy and/or ability to interpolate the actual temperature conditions throughout the entire 3D space of the facility 106 in block B (122). The higher accuracy in interpolating the temperature conditions, the fewer sensor devices 114 may be needed in the facility 106. Accordingly, the computer system 102 may determine a least quantity of sensor devices 114 needed in the facility 106, which further may reduce bandwidth needs and increase transmission speeds between components in the facility 106 over the network(s) 104. The computer system 102 can determine a quantity of the sensor devices 114 to include on machines moving throughout the facility 106, a quantity of the sensor devices 114 to include in stationary positions throughout the facility 106, placement/positioning of the sensor devices 114 in particular locations, rooms, areas, and/or portions of the facility 106, and/or any combination thereof.

The computer system 102 can determine and generate refrigeration controls that can result in lowest energy costs to the facility 106 as a whole. As an illustrative example, if the location 110F is trending below the expected temperature conditions for that location and a quantity of items (those items already being in the location 110F, en-route to the facility 106, or not yet in storage at the facility 106) can be stored at room temperature or temperature levels above a freezing temperature threshold, then the computer system 102 can decide to generate and execute instructions that cause a cool air supply to the location 110F (e.g., from the refrigeration system(s) 140, from fans, etc.) to be cut off or reduced for some period of time(s). These instructions can result in energy cost savings for the facility 106 since the facility 106 does not have to consume energy to cool the location 110F as well as multiple other areas/regions/portions of the facility 106. These instructions can also ensure that the items stored in the location 110F are maintained at temperature levels that do not impact safety and/or quality of those items. Refer to at least blocks W-Z (130-136) and FIGS. 3-4 for further discussion about determining lowest cost temperature conditions for storing the items in the facility 106.

In block E (128), the computer system 102 can return and/or execute the instructions. For example, the instructions can be returned to the refrigeration system(s) 140 for execution. Sometimes, the instructions can be returned to a data store and/or another computer system, such as the third party computer system 112. The third party computer system 112 can, for example, output information about the adjusted facility layout, to be reviewed and used to update the facility 106. The third party computer system 112 may also output the information for review by a relevant user, who then may implement and/or modify some or all of the instructions. In some implementations, returning the instructions can include providing recommendations for adjusting the sensor layout in the facility 106 to a user device or other device of a relevant warehouse/facility worker. The relevant user can review the recommended adjustments and implement or modify said adjustments. By implementing the adjustments, the relevant user can provide input that causes the adjustments to be automatically made by automated machines in the facility. By implementing the adjustments, the relevant user can provide input that causes instructions to be send to other user devices that instruct relevant users to adjust the sensor layout accordingly. In some implementations, the user can provide input to modify the recommended sensor layout adjustments. The user's modifications can be provided to the computer system 102 and used to finetune or otherwise improve the machine learning techniques and/or models that make the determinations described herein.

In another process, the computer system 102 can receive information about inbound items (block W, 130). The item information can be received from devices associated with the freight vehicle(s) 108 transporting items A-N to the facility 106. The devices may include mobile devices of relevant users, such as drivers. The devices may include other computing systems including but not limited to edge computing devices associated with or otherwise part of the freight vehicle(s) 108. The item information may additionally or alternatively be received from the third party computer system 112. The third party computer system 112 can include, for example, a customer computer system that provides information about their items A-N to the facility 106. The third party computer system 112 can be an inventory management system that receives and/or maintains the item information for items that are received in the facility 106. The item information can include, but is not limited to, item quantities, expected storage temperatures, and other expected storage conditions for the items A-N. The expected storage temperatures and expected storage conditions can be provided and/or determined by the third party computer system 112. As described herein, the computer system 102 can perform modeling techniques to determine actual storage temperatures and actual storage conditions for storing the items A-N while still ensuring those items A-N are safe and maintained at quality. Sometimes, the actual storage temperatures and/or actual storage conditions can be different than the expected storage temperatures and/or expected storage conditions.

The computer system 102 may also continue to receive the temperature readings for the facility 106 (block A, 120), which can be used to model the storage locations and storage conditions for the items A-N.

Figure 3:
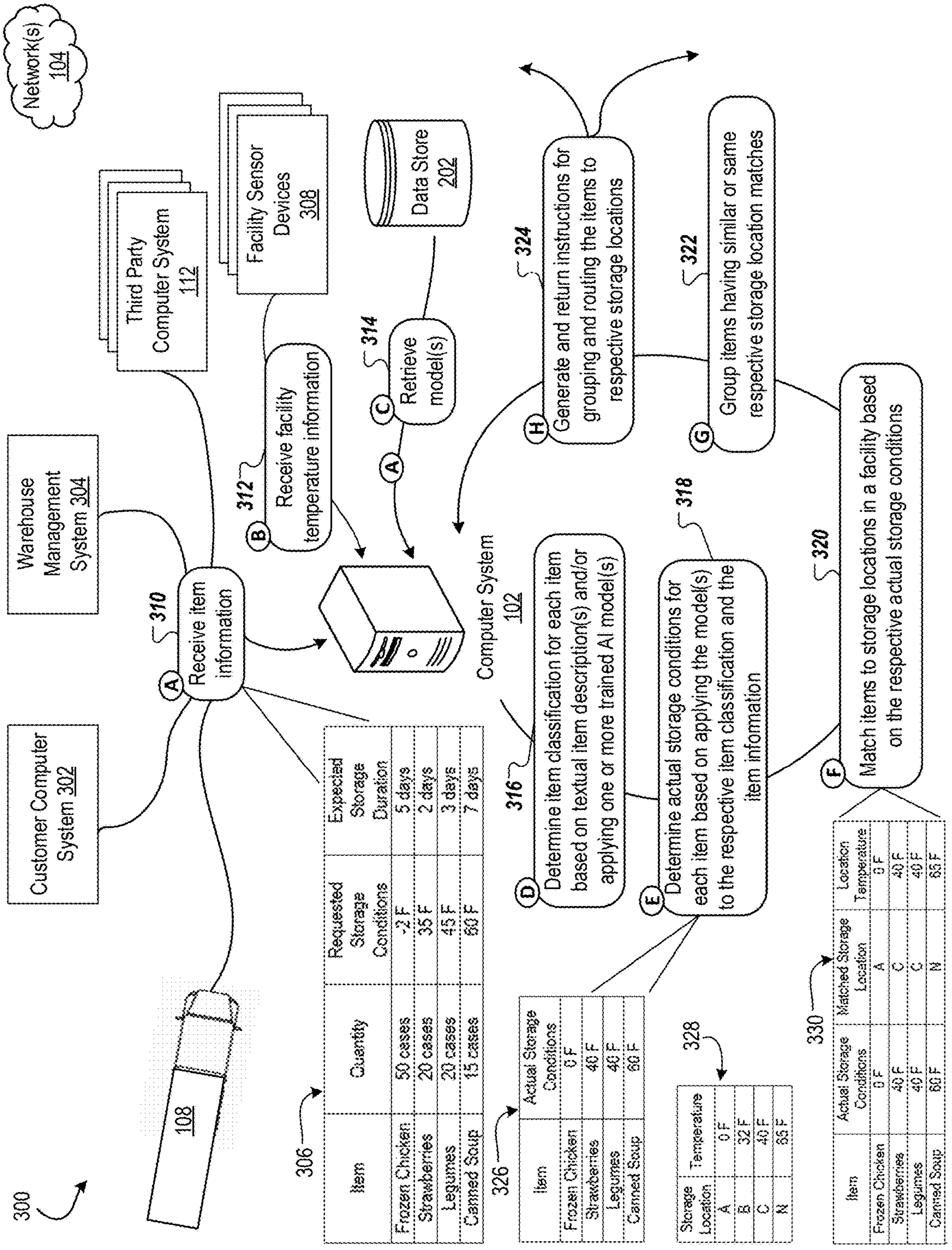
FIG. 3 is a conceptual diagram of a system for determining storage locations for items in a facility based on real-time analysis of temperature information for the facility.

The computer system 102 can model the received item information to determine storage locations based at least in part on expected storage temperatures for the inbound items A-N and actual facility temperature information (block X, 132). The actual facility temperature information can be used in the process represented by blocks W-Z (130-136) after the actual facility temperature information is modeled/interpolated in block B (122). Refer to FIGS. 3-4 for further discussion. In brief, artificial intelligence (AI) techniques and/or machine learning models can be used to determine a type of each of the items A-N and lowest or highest temperature conditions that the determined type of item can be stored at to ensure safety and quality of the determined type of item. Once the computer system 102 determines the temperature conditions that the items A-N can actually be stored at, the computer system 102 can determine which of the locations 110A-N in the facility 106 have temperature conditions that match or otherwise are within an expected temperature range of the actual temperature conditions for storing the items A-N. Such location(s) 110A-N can be selected for the item(s) A-N in block X (132).

In some implementations, in block X (132), the computer system 102 may determine actual temperature conditions for storing the inbound items A-N, determine groupings of the items A-N based on those determined temperature conditions, and identify storage locations 110A-N in the facility 106 having respective actual temperature conditions that correspond to the determined temperature conditions for the groups of the items A-N. Those identified storage locations 110A-N can be used for storing the groups of the items A-N.

The computer system 102 can generate storage instructions for the inbound items A-N in block Y (134). The instructions can be generated based on the determined/selected location(s) 110A-N in the facility 106 in block X (132). The storage instructions can include directions, operations, and/or tasks to be performed by the facility vehicle(s) 116, relevant users, and/or other components in the facility 106 to route the item(s) A-N from the freight vehicle(s) 108 to the selected storage location(s) 110A-N in the facility 106.

The computer system 102 may return the storage instructions in block Z (136). The instructions can be transmitted to one or more of the facility vehicle(s) 116, relevant users, and/or other components in the facility 106 that are or may be assigned the tasks/operations of routing the item(s) A-N to the selected storage location(s) 110A-N in the facility 106. Sometimes, the storage instructions can be transmitted to the third party computer system 112, similarly as the instructions for adjusting the controls of the facility 106 may be transmitted to the computer system 112 in block E (128). Sometimes, the computer system 102 may execute the storage instructions in block Z (136). The facility vehicle(s) 116 or other moving machines in the facility 106 can be configured to automatically execute the storage instructions. For example, said vehicle(s) 116 can automatically route the items A-N from their current locations to their assigned storage locations in the facility 106.

Blocks A-E (120-128) can be performed continuously, persistently, in real-time, or in near real-time as other operations and/or processes are being performed in the facility 106. For example, the blocks A-E (120-128) can be performed in the background as blocks W-Z (130-136) are also being performed. In some implementations, the blocks W-Z (130-136) represent a use case and can be performed in response to performing blocks A-E (120-128). Sometimes, only the blocks A-E (120-128) may be performed, and the other blocks W-Z (130-136) may be performed in only some implementations (e.g., in some facilities but not all facilities). Sometimes, information returned in the blocks W-Z (130-136) can be fed back to the computer system 102 to be used in the blocks A-E (120-128). Similarly, the information returned in blocks A-E (120-128) can be fed back to the computer system 102 to be used in the blocks W-Z (130-136).

Figure 2:
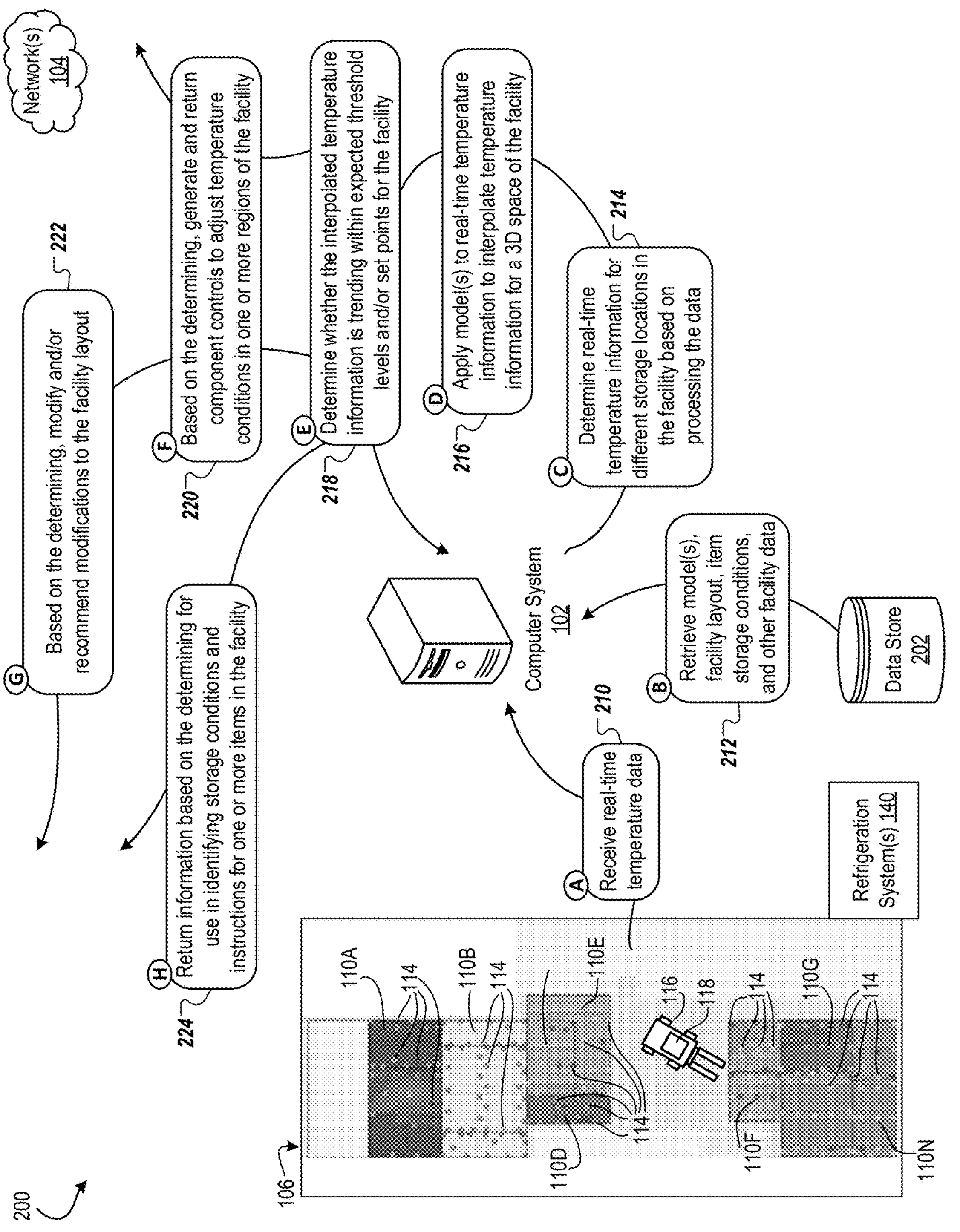
FIG. 2 is a conceptual diagram of a system for analyzing real-time temperature information in a facility to perform operations described herein.

FIG. 2 is a conceptual diagram of a system 200 for analyzing real-time temperature information in the facility 106 to perform operations described herein. FIG. 2 corresponds to the description of blocks A-E (120-128) in FIG. 1. The system 200 can include the computer system 102, the facility 106 having the locations 110A-N, the sensor devices 114, the facility vehicle(s) 116, the sensor device(s) 118 on the vehicle(s) 116, the refrigeration system(s) 140, and a data store 202, all of which may communicate via the network(s) 104 described herein. The data store 202 can be any type of database, data repository, and/or cloud-based storage for maintaining information about, at least, the facility 106 and items that are received/stored at the facility 106.

The computer system 102 can receive real-time temperature data in block A (210) from components of the facility 106, as described in reference to FIG. 1. The temperature data can be continuously received from a grid of the sensor devices 114 in the facility 106 and/or the sensor devices 118 attached to the vehicles 118 moving throughout the facility 106.

The computer system 102 can also retrieve one or more models, a facility layout, item storage conditions, and/or other facility data from the data store 202 (or from multiple data stores) in block B (212).

In block C (214), the computer system 102 can determine real-time temperature information for different storage locations in the facility based on processing the temperature data and the retrieved data.

The computer system 102 can also apply the model(s) to the real-time temperature information to interpolate temperature information for a 3D space of the facility 106 (block D, 216), as described further in reference to FIGS. 1 and 5. The computer system 102 can interpolate the real-time temperature information (e.g., conditions) for every square meter of the facility 106 and/or for different areas of the facility 106, not just within the designated locations 110A-N or where the sensor devices 114 are positioned in the facility 106. Sometimes, the computer system 102 can poll one or more of the sensor devices 114 for their temperature data. If the polled sensor devices 114 are not within threshold distances of each other, then the computer system 102 may apply the model(s) described herein to interpolate actual temperature conditions between the polled sensor devices 114. Sometimes, the computer system 102 can derive sensor locations based on performing regression analysis on information received from the facility 106 and/or the data store 202 about the facility layout and/or placement of the sensor devise 114 in the locations 110A-N. The sensor devices 114 may be positioned at different angles and/or locations in the facility 106 and also may be more dense around certain areas, such as doorways, and more sparse around other areas in the facility 106. Regardless of the density and positioning of the sensor devices 114 in the facility 106, the computer system 102 may accurately model the received temperature data to determine actual temperature conditions in the entire 3D space of the facility 106. As described herein, the computer system 102 can implement TDK techniques to accurately model the data to determine the actual temperature conditions across the entire 3D space or a particular portion of the facility 106. The TDK techniques can be implemented by the computer system 102 using a machine learning model, including but not limited to a neural network.

The computer system 102 can determine whether the interpolated temperature information is trending within expected threshold levels and/or set points for the facility in block E (218). The thresholds can be associated with specific locations, zones, and/or regions of the 3D space of the facility 106. Refer at least to FIGS. 1 and 5 for further discussion.

Based on the determining in block E (218), the computer system 102 may generate and return component controls to adjust temperature conditions in one or more regions of the facility 106 (block F, 220). The controls can be determined for one or more specific locations, zones, and/or regions of the 3D space of the facility 106. Refer at least to FIGS. 1 and 5 for further discussion.

Additionally or alternatively and based on the determining in block E (218), the computer system 102 may modify and/or recommend modifications to the facility layout (block G, 222). For example, the computer system 102 can modify and return identification of one or more regions as designated temperature zones in the facility layout. Given certain facility architectures and/or layouts, the computer system 102 can use modeling techniques to determine appropriate placement and quantity of sensor devices 114 throughout the facility 106. The computer system 102 can determine preferred sensor placement in X, Y, and Z directions. The computer system 102 can also use one or more machine learning models to determine when and how many of the sensor devices 114 can be removed from the facility 106 so that fewer sensor devices 114 are positioned therein. A determination about removing sensor devices 114 from the facility 106 can be made based on balancing costs of the sensor devices 114 and their accuracy. Sometimes, the computer system 102 can determine a new sensor design in one facility and extrapolate that design other facilities using one or more machine learning models. Refer at least to FIGS. 1 and 5 for further discussion.

Additionally or alternatively, the computer system 102 can return information based on the determining for use in identifying storage conditions and instructions for one or more items in the facility 106 (block H, 224). Refer at least to FIGS. 1 and 5 for further discussion.

FIG. 3 is a conceptual diagram of a system 300 for determining storage locations for items in a facility (such as the facility 106 described herein) based on real-time analysis of temperature information for the facility. Operations described in FIG. 3 correspond to at least the blocks W-Z (130-136) described in reference to FIG. 1. In some implementations, freezer temperatures in a facility can be maintained, on average, at or below 0° F. However, biologically driven constraints on food storage can include available water ($A_w$) needed to support bacterial growth. Lean beef, for example, has a high moisture content (75-80%) and corresponding $A_w$ (99.5), which can support bacterial growth in fresh products. A freezing process 'binds' available water to solids and reduces the $A_w$ to a point where bacterial growth may no longer be possible. Most bacteria, for example, may not grow at a water activity range below 0.91, and most molds may cease to grow at water activities below 0.70. Accordingly, t $A_w$ can be reduced to levels incapable of supporting bacterial growth when products reach approximately 15° F. Hence, increasing endpoint freezing temperatures from 0° F. to +5° F. can present significant cost and time savings for the facility, without presenting food safety risk for bacterial growth. Such an increase in freezing temperatures may also provide a comfortable 'margin of error' below the 15° F. threshold for bacterial growth.

The facility may overcool locations therein. Overcooling relates to an inability for refrigeration systems to maintain temperatures within a narrow range in the facility. Spatial temperature variations or hotspots can therefore be a serious concern for food safety and quality if not managed properly. The disclosed techniques therefore provide reactive and proactive solutions that can result in saving energy costs (e.g., by letting certain location temperatures rise within temperature ranges that are still suitable for food quality/safety) for the facility.

Still referring to FIG. 3, the system 300 can include the computer system 102, the freight vehicle(s) 108, the data store 202, the third party computer system(s) 112, a customer computer system(s) 302, a WMS 304, and facility sensor devices 308. Any of these components can communicate with each other via the network(s) 104. The customer computer system(s) 302 and/or the WMS 304 may be one or more of the third party computer system(s) 112 described herein. The facility sensor device(s) 308 can include any of the sensor devices 114 and 118 described throughout this disclosure.

The computer system 102 can receive item information 306 in block A (310). The item information 306 can be received from one or more of devices of the freight vehicle(s) 108, the customer computer system(s) 302, the WMS 304, and/or the third party computer system(s) 112. The item information 306 may also be retrieved from the data store 202. As described herein, the item information 306 can include a variety of information related to items that are received at the facility. For example, the item information 306 can include, but is not limited to, for each item, an item name and/or type, a quantity of the item, requested (e.g., expected) storage conditions, and/or expected storage duration.

The computer system 102 can also receive facility temperature information in block B (312) from the facility sensor devices 308. Further, the computer system 102 can retrieve one or more model(s) from the data store 202 in block C (314). In some implementations, the computer system 102 can retrieve, from local memory, determinations that have been previously made by the computer system 102 about actual temperature conditions in the facility, as described further in reference to FIGS. 1, 2, and 5.

In block D (316), the computer system can determine item classification for each item based on textual item description(s) and/or applying one or more trained AI models to the information received in block A (310). The model(s) can, for example, receive the item information 306 and for each item, determine and classify the item based on its type. The model(s) can be trained to execute textual analysis and/or semantic analysis on any of the textual item descriptions or other text in the item information 306. As an illustrative example, the model(s) can determine, according to textual analysis/semantic analysis of the item information 306 for frozen chicken, that the frozen chicken item is a type of fresh protein meat product. The model(s) can generate output indicating such a classification. The model(s) can determine that strawberries is a type of fresh fruit product. The model(s) can determine that legumes are a type of fresh vegetable product. The model(s) can determine that canned soup is a type of non-fresh preserved product.

In block E (318), the computer system 102 can determine actual storage conditions for each item based on applying the model(s) to the respective item classification and the associated item information 306. For examples, the computer system 102 can apply food modeling techniques to determine safe temperatures for storing the items according to their classified types. One or more models retrieved in block C (314) can be trained to receive a variety of inputs, including but not limited to the item classification and/or packaging information about the items.

The models can be trained in training process that includes inoculating different types of items with known pathogens and measuring growth or changes in the pathogen over time while the items are stored in different temperature conditions. Data can be collected with sensors that are proximate and/or puncturing the items. The data can be provided to the computer system, annotated or labeled (e.g., by humans and/or automatically by the computer system), and then used as training data to train the models to correlate and detect safest temperature ranges at which to store the items of particular types/classifications without risking the growth or development of pathogens therein at such temperature ranges. Sometimes, the computer system can generate mappings of the particular types/classifications of items to safe temperature ranges, based on the training process, and then reference the mappings during runtime to determine the actual storage conditions for each item in block E (318). The determination made using the mappings can be achieved by the computer system performing one or more algorithms and/or applying the models described herein. Refer to FIG. 4 for additional discussion about the various inputs that may be used to accurately model and determine actual storage conditions for the items.

As shown in item information 326, the computer system 102 applied the modeling techniques to determine that the frozen chicken can be safely stored at 0° F. (whereas the customer had requested storage at −2° F.), the strawberries can be safely stored at 40° F. (whereas the customer requested storage at 35° F.), the legumes can be safely stored at 40° F. (which matches the customer request), and the canned soup can be stored at 60° F. (which matches the customer request).

Still referring to block E (318), once the model determines and outputs the type of the item, the computer system can retrieve predetermined mappings of different item types to safe storage temperatures. The mappings can be generated by the computer system using the disclosed techniques. The mappings can include upper and lower temperature bounds, such as variations in warmest temperatures for storing the particular type of item and/or coldest temperatures for storing the particular type of item. The mappings can be stored by a data store. Sometimes, the computer system can automatically update or modify the mappings over time. Sometimes, the computer system can automatically update or modify which items may be classified as a particular type in the mappings.

As an illustrative example, the computer system can perform the disclosed techniques in order to classify items (e.g., filet, trim, ribs, steak, thigh, ribeye) as a skeletal meat type, which is then mapped to a first temperature range. As another example, the computer system can classify other items (e.g., intestines, liver, stomach, heart) as an offal meat type, which is then mapped to a second temperature range. The computer system can classify other items (e.g., seafood) as a seafood and fish type having a third temperature range, other items (e.g., cheese, milk, butter) as a dairy type having a fourth temperature range, other items (e.g., ice cream) as an ice cream type having a fifth temperature range, eggs as an eggs type having a sixth temperature range, pet food as an animal protein type having a sixth temperature range, other items (e.g., fruit products, grain products, processed meats, chocolate) as a processed products type having a seventh temperature range, other items (e.g., bread, pasta, dessert, sauce) as a finished good type having an eighth temperature range, other items (e.g., juice, soda, water) as a drink type having a ninth temperature range, vegetables and fruits as a produce type having a tenth temperature range, legumes as a legumes type having an eleventh temperature range, nuts and seeds as a nuts type having a twelfth temperature range, other items (e.g., sweeteners, alcoholic drinks) as a basic type having a thirteenth range, other items as other (e.g., not for human consumption) having a fourteenth range, and/or any other combination thereof. One or more other type classifications can be determined and used by the computer system.

In some implementations, the computer system 102 can receive inbound data from a customer, which can include temperatures for storing the inbound items. These temperatures can include but are not limited to more general temperature ranges, such as freezer storage, zero degree storage, etc. The techniques described with respect to blocks D (316) and E (318) can be performed by the computer system to finetune the temperatures for storage that are included in the inbound data from the customer. Finetuning the temperatures for storage, as described herein, can include determining a safest, warmest temperature at which to store the particular type/classification of each inbound item.

The computer system 102 can match the items to storage locations in the facility based on the respective actual storage conditions determined in block E, 318 (block F, 320). The computer system 102 can retrieve storage location information 328 (e.g., from the data store 202, from the WMS 304, from other third party computer systems 112, and/or from local memory of the computer system 102). The computer system 102 can then compare the storage location information 328 to the item information 326 to determine which real-time temperature conditions of the storage locations corresponds to the actual storage conditions for the items. By matching the items to the storage locations, the computer system 102 may generate item storage information 330. The computer system 102 can perform a grouping algorithm in order to map item types to correct storage locations. The grouping algorithm can be an optimization algorithm as a storage temperature cannot exceed a maximum storage temperature of any item in a particular storage location.

In the example of FIG. 3, the storage location information 328 indicates that storage location A has a real-time temperature of 0° F., storage location B has a real-time temperature of 32° F., storage location C has a real-time temperature of 40° F., and storage location N has a real-time temperature of 65° F. As shown by the storage information 330, the frozen chicken has an actual storage temperature of 0° F. and thus is matched with storage location A. The strawberries and legumes both have an actual storage temperature of 40° F. and thus are matched with storage location C. The canned soup has an actual storage temperature of 60° F. and is matched with the storage location N. Although the storage location N is 5° F. warmer than the actual storage temperature for the canned soup, this disparity in temperature may be okay because the canned soup is a non-perishable good that may not spoil within a larger range of temperature values than perishable goods like protein and produce.

The computer system 102 can group items having same or similar respective storage location matches in block G (322). The computer system 102 may use one or more clustering algorithms to determine appropriate groups of the items that ensure both types of items are maintained at expected levels of safety and quality. In the example of FIG. 3, the strawberries and legumes are grouped together. Grouping together different types of items may reduce an amount of operations and/or tasks performed in the facility to move the items to storage locations in the facility. The grouping can also result in overall energy cost savings for the facility (since items can be grouped and stored in a same location at a same temperature, other locations may be maintained at other temperatures that are preferred for storing other items in the facility).

In block H (324), the computer system 102 can generate and return instructions for the grouping and routing of the items to respective storage locations. The instructions can be returned to components of the facility as described herein for automated execution (e.g., conveyors, forklifts, robots, automated machines). The instructions can sometimes be executed automatically by the computer system 102. Accordingly, the computer system 102 can determine routing and placement of the items in different locations in the facility to ensure economic and efficient energy usage as compared to simply taking a customer's request that their items need to be stored at a particular temperature. The computer system 102 may leverage bin packing algorithms to parcel items out to freezer rooms or other storage locations having different storage temperatures. Sometimes, as described in reference to FIGS. 1 and 2, the computer system 102 can implement one or more machine learning techniques and/or algorithms to determine how to separate freezer rooms or other storage locations into different temperature zones in the facility to ensure that items that need to be stored at lower temperatures or particular temperature conditions can be grouped and stored together while other items that can be stored at baseline freezer temperatures can be grouped and stored together. In some illustrative examples, increasing a temperature in a storage location by 1 degree can result in approximately 2% or more of power/energy saving for the facility. Therefore, the computer system 102 can implement the disclosed techniques to adjust temperatures in the facility and determine what items to group and store in those adjusted-temperature locations to cause energy savings for the facility while still ensuring the items are maintained according to safety and quality guidelines.

Figure 4A:
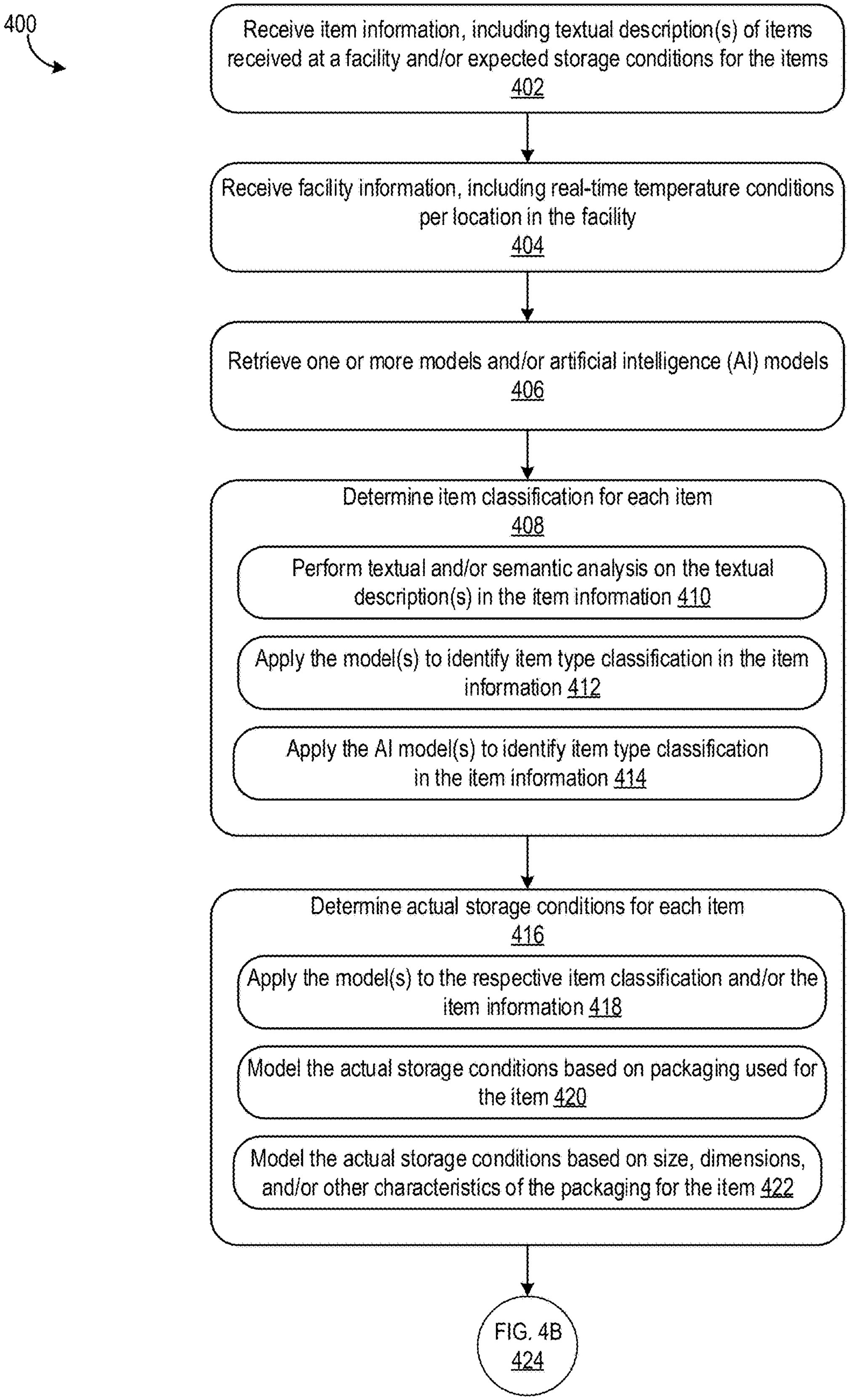
FIGS. 4A and 4B is a flowchart of a process for determining storage locations for items in a facility.
Figure 4B:
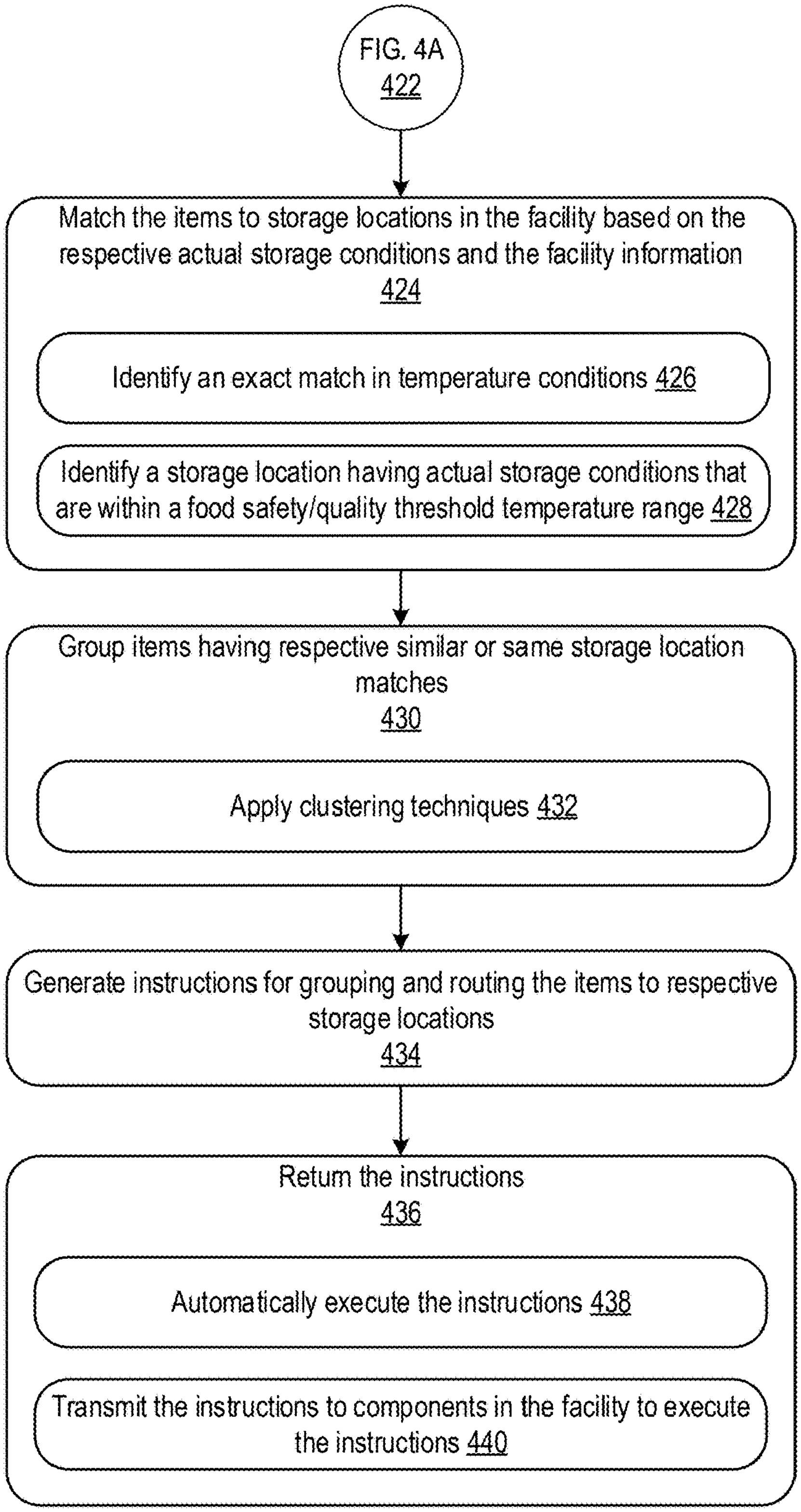

FIGS. 4A and 4B is a flowchart of a process 400 for determining storage locations for items in a facility. The process 400 can be performed for every inbound item that is logged as being delivered to the facility within some period of time (e.g., deliveries over a current day or a next day). The process 400 can be performed for items that have been received at the facility and need to be stored within some upcoming period of time. Sometimes, the process 400 can be selectively performed for only some inbound items and/or some items that are at the facility. In yet some implementations, the process 400 can be performed in response to receiving some triggering event from a third party computer system, such as an inbound customer request/delivery/order, an update on inventory from an inventory management system or WMS of the facility, a human worker device in the facility, etc.

The process 400 corresponds at least to descriptions in FIGS. 1 and 3. The process 400 can be performed by the computer system 102 describe herein. The process 400 can be performed by any other computing system, controller, network of computing devices, edge devices, user devices, and/or cloud-based systems. For illustrative purposes, the process 400 is described from the perspective of a computer system.

Referring to the process 400 in both FIGS. 4A and 4B, the computer system can receive item information, including textual description(s) of items received at a facility and/or expected storage conditions for the items in block 402. Refer to at least FIG. 1 for further discussion about the item information that can be received from various sources, including but not limited to freight vehicles transporting the items to the facility, customer computer systems, WMSs, inventory management systems, and other third party computer systems.

The computer system can also receive facility information, including real-time temperature conditions per location in the facility in block 404. As described herein, the facility information can include temperature readings that are generated by sensor devices placed throughout the facility and/or moving throughout the facility on vehicles, such as forklifts or other automated machines/vehicles described herein. Sometimes, the temperature readings can be captured and then stored temporarily, such as in cache memory of the computer system. Sometimes, the real-time temperature conditions can include temperature information that has been interpolated by the computer system or another computer system using the techniques described herein. The facility information can include other information, including but not limited to information about incoming items over some period of time, information about pallets to be built and delivered to customers over some period of time, information about items and/or pallets of items to blast freeze/freeze, tasks and/or operations to be performed by one or more human workers and/or facility vehicles, etc.

In block 406, the computer system can retrieve one or more models and/or AI models. The models can be retrieved from data stores described herein. The models can sometimes be stored in local memory, such as local memory of the computer system. The computer system can retrieve multiple models to perform different operations described herein. For example, the computer system can retrieve one model for interpreting the item information in block 402 and another model for determining actual storage conditions for the inbound items. The second model can receive the output from the first model as input to determine the actual storage conditions for the inbound items. Sometimes, multiple models can be configured to run simultaneously, in parallel, and/or in series.

The computer system can determine item classification for each item based on the information and/or models received in blocks 402, 404, and 406 (block 408). To determine the item classification for each item, the computer system can perform textual and/or semantic analysis on the textual description(s) in the item information (block 410). For example, the computer system can implement one or more textual analysis algorithms to interpret the text in the item information and identify keywords in that text that may correspond to a type of the item. Sometimes, the algorithms can be configured to identify multiple keywords. The same and/or additional algorithms can be used to score and/or rank the identified keywords, where the keyword that most likely corresponds to an accurate type of the item is ranked or scored higher than the other keywords. The keywords may include but are not limited to words that generically identify the item, such as produce, protein, meat, vegetables, fruits, fish, soup, canned, chips, snacks, nuts, frozen, etc. Sometimes, the computer system can implement one or more semantic analysis algorithms, which can be used to interpret meaning in the text of the item information, the meaning indicating the type of the item. For example, such an algorithm can be used to identify that an item is generically categorized as frozen produce based on the following textual description of the item identified in the item information: "the leafy greens are stored best in −5° F." The same and/or additional algorithms may also be used to score the results from identifying the type of the item from textual descriptions of the items.

Additionally or alternatively, the computer system can apply the model(s) to identify item type classification in the item information (block 412). Additionally or alternatively, the computer system can apply the AI model(s) to identify item type classification in the item information (block 414). The model(s) and/or AI model(s) can be trained to perform the techniques described above regarding the textual and/or semantic analysis.

Next, the computer system can determine actual storage conditions for each item in block 416. As described herein, the computer system can apply one or more of the same or different models to the respective item classification and/or item information to determine the actual storage conditions, which may differ from requested storage conditions provided by an associated customer and/or other relevant stakeholders in the supply chain. The computer system can apply one or more models to the item classification and/or item information to determine storage conditions based on the specific type of item (e.g., commodity) and/or packaging details for the items.

For example, the computer system can apply the model(s) to the respective item classification and/or the item information in block 418. In other words, in block 418, the computer system can determine, based on a type of commodity of the item (which is determined based on processing the item information to determine the item classification), what the actual storage conditions are for the item, or a range of acceptable storage conditions for the item. As an illustrative example, regarding commodities, in some implementations, seafood items can be exempt from modifications to endpoint freezing temperatures since seafood items may have higher/tighter thresholds for food safety. Meat proteins, such as beef, pork, and poultry can be good candidates for higher Upper Control Limits (UCLs) for temperature freezing conditions. In other words, these types of items can be stored at higher temperatures, such as up to +5° F., without causing negative impact on quality and safety of those items. Because locations in the facility that store the meat proteins can be maintained at higher temperatures, energy costs can be reduced in the facility (in other words, a refrigeration system may not have to operate extensively or at all to maintain these locations at lower temperatures). Fruit and vegetables can be temperature may sometimes be sensitive depending on size of cut and packaging. For example, drums or concentrate may be inelastic with regard to temperature impact on quality and safety, whereas individual quick freezing (IQF) cubes or berries may be more sensitive to small temperature fluctuations. These different types of food items can therefore be modeled using the disclosed techniques in order to determine a highest temperature that they can be stored at that provides energy savings for the facility and ensures safety and quality of those items.

Additionally or alternatively, the computer system can model the actual storage conditions based on packaging used for the item in block 420. The packaging information can be provided as part of the item information received in block 402. Regarding packaging, a number of layers of packaging and rigidity of such packaging may be considered when modeling temperature conditions for storing the items in the facility. Drums can be rigid and configured to protect items therein from temperature fluctuations. Because the drums can insulate the items, the items can be stored at higher temperatures. Corrugated fibers can be good insulators, in some implementations, and also can result in the packaged items being stored at higher temperatures. Inner packaging (e.g., poly bags, vacuum sealed, clam shell) can add insulative properties and protect inner items from temperature fluctuations. Hence, items with multiple layers of rigid packaging (and/or corrugated with inner vacuum sealed products) can be stored in locations having higher temperature conditions than traditional freezer locations or rooms (or locations having temperature conditions that are expected for the items if those items were not in drums or other insulated packaging), which can result in energy savings for the facility.

Additionally or alternatively, the computer system can model the actual storage conditions for the item based on size, dimensions, and/or other characteristics of the item's packaging (block 422). Regarding size of packaging, the larger the package, the more resistant it can be to temperature fluctuations. Accordingly, larger cases of proteins can be preferred candidates for storing in facility locations having higher temperature conditions to ensure energy savings for the facility while maintaining safety and quality of those proteins. On the other hand, smaller packages of pizzas, for example, may not do well at higher temperatures and thus may be candidates for storing in traditional freezer locations or rooms (or locations having temperature conditions that are expected for the pizzas, regardless of their packaging).

The computer system may also match the items to storage locations in the facility based on the respective actual storage conditions and the facility information (block 424). For example, the computer system can identify an exact match in temperature conditions (block 426). The computer system can employ an optimization algorithm (e.g., a constrained optimization algorithm) that can be mapped to a bin-packing algorithm. For example, storage location temperature can be determined by a maximum storage temperature of all items in that storage location. Low temperature items can be grouped together such that all temperatures for all storage locations are as high as possible. If all the low temperature items are evenly spread out to all the storage locations, then all the storage locations can be low temperature.

Sometimes, block 426 can be performed and if the computer system does not identify a storage location having same temperature conditions as the item, then the computer system can identify a storage location having temperature conditions that are within a predetermined range from the actual storage conditions for the item. Additionally or alternatively, the computer system can identify a storage location having actual storage conditions that are within a food safety/quality threshold temperature range (block 428). The threshold temperature range can be defined for each type of food/food classification. That threshold temperature range can sometimes be defined using the models described herein. In some implementations, the threshold temperature range can be predetermined by a third party and then provided to the computer system.

In blocks 424-428, the computer system can match the items to the storage locations based on comparing the actual storage conditions determined above to the facility information. The facility information can indicate, for each storage location in the facility, current temperature readings, current humidity and/or pressure levels, and other relevant ambient conditions information for the facility. The facility information can also indicate, for each storage location in the facility, expected changes in ambient conditions over the course of some period of time. For example, the facility information can indicate that a particular storage room will be increasing to +5° F. over the next 12 hours, which means that fans and/or refrigeration units will be turned off with respect to that particular storage room. The facility information can also indicate other items that will be or are currently being routed in and out of each storage location in the facility. This information can be useful to group similar types of items in the same storage location(s). As yet another example, the facility information can indicate what actions and/or operations may be performed in each storage location over the course of some period of time. For example, the information can indicate that a door in a particular room will be opening 5 times over the course of 12 hours to bring items in and out of storage in the room. The information also may indicate how the temperature and other ambient conditions are expected to change over the 12 hours in response to the door opening multiple times.

In block 430, the computer system can group items having respective similar or same storage location matches. For example, the computer system may apply clustering techniques to group the items for storage, as described above regarding block 426 (block 432). Item constraints can be predetermined and provided to the computer system. The computer system can employ one or more algorithms described herein to match an item description to a matching or otherwise right item constraint. Then, a bin packing algorithm, or similar optimization algorithm, can determine what items go to which storage locations to maximize storage temperatures for all storage locations.

As another example, the computer system can identify the items that have been matched with the same storage locations and then group those identified items. Sometimes, even if the items are matched with different storage locations, the computer system can determine whether the storage locations are nearest neighbors with respect to their temperature conditions (in other words, those storage locations have temperature conditions within threshold ranges of each other). If the storage locations are nearest neighbors, then the computer system can group the items intended for the storage locations so that all the grouped items can be routed to one of those storage locations.

In some implementations, blocks 430-432 can be performed before or while performing blocks 424, 426, and 428. For example, the computer system can first identify which of the items have actual storage conditions that are the same or within some predetermined threshold range, then group those items together. As a collective, the computer system can then match the group of items to a storage location in the facility having temperature conditions that are the same as or within some predetermined threshold range of the collective storage conditions for the group.

The computer system may also generate instructions for grouping and routing the items to respective storage locations in the facility (block 434). The instructions may indicate which inbound items are to be grouped together once they are unloaded from inbound freight vehicle(s). The instructions may indicate an order by which to unload the inbound items and/or arrange them for storage in the respective storage location. Various other instructions can also be generated based on the determinations made in the process 400.

The computer system can then return the instructions in block 436. Sometimes, the computer system may automatically execute the instructions (block 438). Automatically executing the instructions can include causing components (e.g., forklift, conveyor belts, AGVs) in the facility to perform operations, such as routing the grouped items to a particular storage location in the facility. Sometimes, the computer system may transmit the instructions to components in the facility to execute the instructions (block 440). The instructions can be transmitted to components such as forklifts, other facility vehicles, devices of human workers, an inventory management system, a WMS, etc.

Figure 5A:
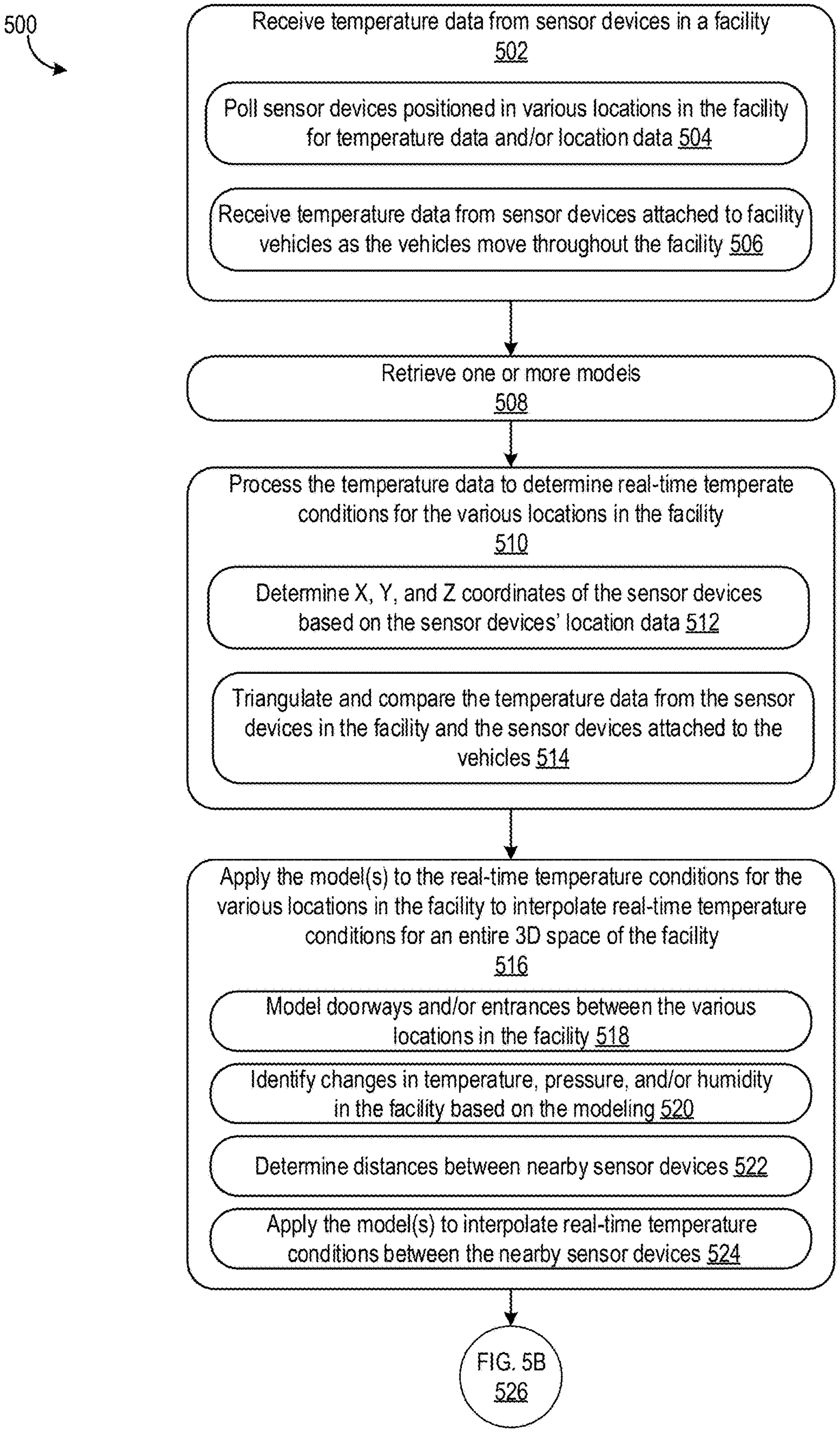
FIGS. 5A and 5B is a flowchart of a process for determining and modifying information about a facility based on real-time temperature information for the facility.
Figure 5B:
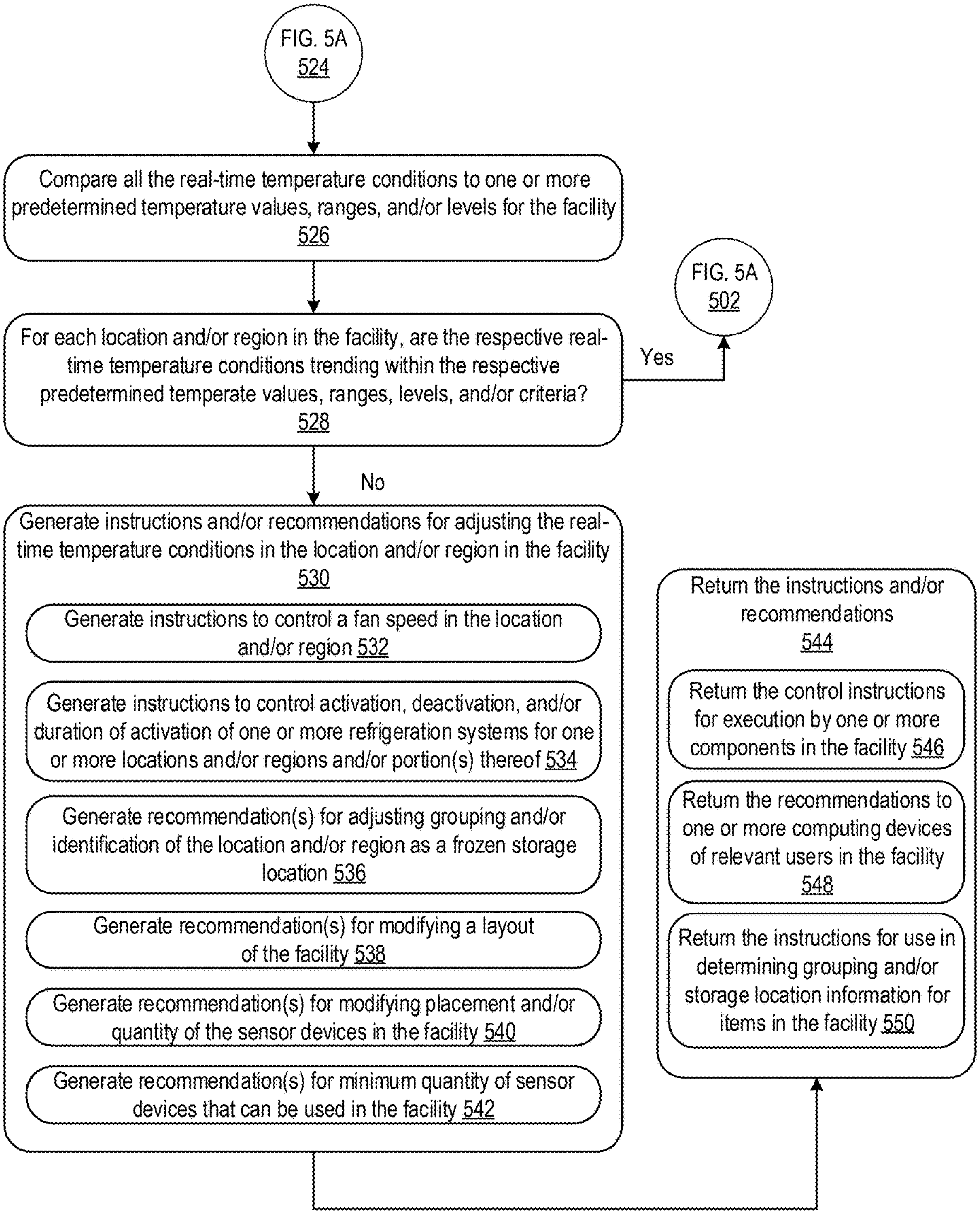

FIGS. 5A and 5B is a flowchart of a process 500 for determining and modifying information about a facility based on real-time temperature information for the facility. The process 500 can be performed continuously, such as whenever temperature readings are received from sensors placed throughout the facility. The process 500 can be performed at predetermined time intervals, such as once a day, every 12 hours, every 8 hours, every 4 hours, every 1 hour, every 30 minutes, etc. In some implementations, the process 500 can be performed in response to a triggering event, such as receiving user input from a relevant user requesting information about the facility based on the real-time temperature information for the facility. The requested information can include a layout of the facility storage locations based their actual temperature conditions and how those temperature conditions are trending. Various other information requests can be triggering events for the process 500.

The process 500 corresponds to at least FIGS. 1 and 2 described above. The process 500 can be performed by any other computing system, controller, network of computing devices, edge devices, user devices, and/or cloud-based systems. For illustrative purposes, the process 400 is described from the perspective of a computer system.

Referring to the process 500 in both FIGS. 5A and 5B, the computer system can receive temperature data from sensor devices in a facility (block 502). The computer system can poll sensor devices positioned in various locations in the facility for temperature data and/or location data in block 504. The computer system may additionally or alternatively receive temperature data from sensor devices attached to facility vehicles as the vehicles move throughout the facility in block 506. In some implementations, the computer system can receive the temperature data from all the sensor devices in the facility. Sometimes, the computer system can receive the temperature data from a subset of the sensor devices in the facility or less than all the sensor devices in the facility. Sometimes, for example, the computer system can poll the sensor devices in a particular region of the facility and/or the sensor devices in a particular storage location in the facility. As an illustrative example, the computer system can continuously receive the temperature data from a sensor device attached to a forklift moving throughout the facility. Using location data associated with the forklift and/or the sensor device attached to the forklift, the computer system may poll nearby sensor devices in the facility that are within some threshold distance of the forklift as the forklift moves throughout the facility. By doing so, the computer system may compare the temperature data of the sensor device attached to the forklift to temperature data of nearby polled sensor devices to determine accuracy and temperature conditions in an entire region of the facility. Although the sensor device is described as being attached to a forklift, the sensor device can also be attached to other automated machines and/or moving machines in the facility, including but not limited to robots and/or AGVs.

The computer system can retrieve one or more models in block 508. The models, as described throughout this disclosure, can be stored in one or more data stores and/or local memory of the computer system. The model(s) can be a neural network. The model(s) can be trained based on past temperature sensor measurements. A neural net of the model(s), for example, can learn how the temperature measurements correlate throughout a storage location (e.g., room). Once the model(s) is trained, the computer system can query any X,Y,Z location given the latest (Tx,Ty,Tz) temperature measurements collected from sensors in the facility.

The computer system can process the temperature data to determine real-time temperature conditions for the various locations in the facility in block 510. In other words, and as described herein, the computer system can determine the temperature conditions (e.g., temperature, pressure, humidity) for every square/cubic meter of the facility, including regions in the facility where physical sensor devices may not be positioned. For example, the computer system can determine X, Y, and/or Z coordinates of the sensor devices based on the sensor devices' location data (block 512). The location data can be received when the sensor devices are polled in blocks 504 and/or 506. As another example, the computer system may already know the X, Y, and Z coordinates of each sensor device in the facility. The computer system can process the location data to determine an exact location in X, Y, and/or Z coordinates of each sensor device (each sensor device that provides temperature data and/or each sensor device in the facility, regardless of whether the sensor device provides the temperature data in the process 500). Sometimes, the location data can already include the location of the respective sensor device in the X, Y, and Z coordinates, and the computer system may simply extract this information from the location data.

Additionally or alternatively, the computer system can triangulate and compare the temperature data from the sensor devices in the facility and the sensor devices attached to the vehicles (block 514). The comparison may also be performed based on and/or using the location data. For example, the computer system can identify which of the sensor devices are proximate each other (e.g., nearest neighbors, within some threshold radius and/or distance from each other, within a same storage location, room, or region in the facility) and then compare their temperature data. The computer system can compare the temperature data for the proximate sensor devices to identify a predicted temperature condition for the region where those proximate sensor devices are located or any region/location in the facility. The model(s) described above can be used to identify the predicted temperature condition. For example, a neural network can advantageously be used to obtain a full X, Y, and Z temperature prediction for the entire region, any region/location in the facility, etc. That predicted temperature condition may then be used in downstream operations, such as determining actual, real-time temperature conditions for the facility as a whole and/or in the particular region where those proximate sensor devices are located.

In block 516, the computer system can apply the model(s) to the real-time temperature conditions for the various locations in the facility to interpolate real-time temperature conditions for an entire 3D space of the facility. The model(s) can be trained to interpolate the temperature conditions for the entire space of the facility, including regions or portions of the facility where sensor devices may not be physically positioned. The model(s) can be trained to interpolate the temperature conditions for an entire region in the facility based on temperature data for sensors that are proximate each other within and/or surrounding that region.

For example, as part of block 516, the computer system may model doorways and/or entrances between the various locations in the facility (block 518). The computer system can retrieve facility information (e.g., from a data store, from a WMS), which may include a layout of the various locations in the facility. The layout can indicate where doors and/or entrances are located throughout the facility. Sometimes, the retrieved information can also include tasks and/or operations to be performed in the facility, including tasks to move between different locations in the facility, through doors and/or entrances. The retrieved information may additionally or alternatively include historic tasks and/or operations that were performed in the facility, those historic tasks indicating movement and frequency of the movement between the locations through doors and/or entrances. The retrieved information can be provided as input to the model, which can be trained to determine frequency that the doors and/or entrances are used, temperature conditions around the doors and/or entrances when they are used, and projected impact on the temperature conditions in the locations and/or proximate the doors and/or entrances when those doors and/or entrances are used.

Additionally or alternatively, the computer system may identify changes in temperature, pressure, and/or humidity in the facility based on the modeling (block 520). As indicated above, the model can be trained to project expected changes in temperature conditions around the doors and/or entrances in the facility as those doors and/or entrances are frequented over some period of time.

Additionally or alternatively, the computer system can determine distances between nearby sensor devices (block 522), such as based on the sensor devices' location data, the determined X, Y, and Z coordinates of the sensor devices (block 512), and/or the triangulation and comparison of the temperature data amongst the sensor devices in the facility (block 514). The computer system can then apply the model(s) to interpolate (or otherwise predict) real-time temperature conditions between the nearby sensor devices (block 524), and thus determine the real-time temperature conditions for the entire 3D space of the facility. Sometimes, interpolating the temperature conditions can include assuming that temperature varies linearly between points. This may not be the case for all temperature points, for example at doorways and doors in the facility. Therefore, forklift temperature data can also be used to sample various locations between sensor devices. All the collected temperature data can then be processed by the model(s) described above (e.g., a neural network) to learn an appropriate interpolation. The appropriate interpolation is thus a prediction of the real-time temperature conditions. Accordingly, the computer system can map out the temperature conditions for every corner of the facility using the available temperature data for the facility. Actual corners in the facility can be challenging to map. However, if a pallet is stored in a corner, then a forklift, which also collects temperature data, eventually will move to the corner and sample the temperature there as well.

In block 526, the computer system can compare all the determined real-time temperature conditions to one or more predetermined temperature values, ranges, and/or levels for the facility. In other words, the computer system can compare the determined real-time temperature conditions for a particular storage location or region in the facility to expected predetermined temperature values, ranges, and/or levels associated with that location or region. The computer system can perform this comparison to determine whether the actual conditions of the location or region are trending within expected conditions for that location or region. If the actual conditions are not trending within the expected conditions, then the computer system can determine one or more operations to be performed to adjust the actual conditions (e.g., by increasing/decreasing temperature, humidity, and/or pressure within the particular location or region).

As part of block 526, for each location (e.g., designated storage location based on the layout or other facility information associated with the facility) and/or region in the facility, the computer system can determine whether the respective real-time temperature conditions are trending within the respective predetermined temperature values, ranges, levels, and/or other criteria (block 528). If yes, then the computer system returns to block 502 and continues through the process 500. Sometimes, the process 500 may stop since the actual conditions in the particular location are as expected for that location. If no, then the computer system proceeds to block 530, which means that action may be required to adjust the actual conditions in the particular location. In some implementations, all locations within a same room/particular location can be designated with a same storage temperature (e.g., freezer versus cooler). In some implementations, the computer system can determine that the particular location (e.g., room) should be cooled more (e.g., to a predetermined temperature) to ensure that an out-of-specification storage location can be cooled back to compliance (e.g., predetermined thresholds).

In block 530, the computer system can generate instructions and/or recommendations for adjusting the real-time temperature conditions in the location and/or region in the facility. Those instructions and/or recommendations are illustrated in blocks 532-542. The following blocks 532-542 are merely illustrative examples, and one or more additional or other instructions and/or recommendations are also possible.

For example, the computer system can generate instructions to control a fan speed in the location and/or region (block 532). The computer system can generate instructions to increase the fan speed for a predetermined period of time to cause the location and/or region to decrease in temperature to be within the predetermined temperature range for that location. The computer system can generate instructions to decrease the fan speed and/or turn off the fan for predetermined periods of time to cause the location and/or region to increase in temperature to be within the predetermined temperature range for that location. Sometimes, the computer system can generate instructions to intermittently activate and/or deactivate the fan at varying speeds over some predetermined period of time to cause the location and/or region to maintain the predetermined temperature range.

In some implementations, the computer system can map causality between evaporators turning on and locations changing in temperature. The mapping can be accomplished using a model, such as a neural network. The computer system can determine which X, Y, Z location in a storage location is out-of-specification (e.g., not at an expected predetermined temperature value or range) and provide that X, Y, Z location to the neural network. The neural network can generate output indicating which evaporator to turn on, how much, and for how long in order to return the storage location to temperature compliance.

The computer system can generate instructions to control activation, deactivation, and/or duration of activation of one or more refrigeration systems for one or more locations and/or regions and/or portions thereof (block 534). Similar to the fans discussed in block 532, the computer system can determine controls of the refrigeration system(s) that cause the locations and/or regions in the facility to operate within the respective predetermined temperature conditions. The computer system may generate controls to deactivate the refrigeration system for a particular storage location so that the storage location warms up to a temperate level that is acceptable for safely storing items stored therein. As another example, the computer system may generate controls to activate the refrigeration system for another location where items that require a freezing storage temperature are being maintained or will be maintained.

As another example, the computer system can generate one or more recommendations for adjusting a grouping and/or identification of the location and/or region as a frozen storage location (block 536). For example, the computer system can determine that a sufficient quantity of storage locations in the facility are currently being maintained at freezing temperatures required for storing one or more groups of items, and that any other storage locations in the facility can be maintained at higher temperatures, thereby resulting in energy cost savings for the facility. As another example, the computer system can determine that less storage locations are required to be maintained at the freezing temperatures than currently designated, so the computer system can generate a recommendation to maintain only some storage locations at the freezing temperatures and then maintain the other storage locations at higher temperatures. This can also result in overall energy cost savings for the facility.

The computer system may generate one or more recommendations for modifying a layout of the facility (block 538). The recommendations can include designating one or more freezer rooms as non-freezer storage locations. Freezer can be a relative term where a storage temperature does not necessary mean 0° F., but rather can vary based on stored item constraints. The recommendations can include designating multiple rooms proximate each other as one non-freezer storage location (such as a storage location maintained at room temperature or some predetermined temperature value about a freezer-room temperature value or temperature range).

The computer system can generate one or more recommendations for modifying placement and/or quantity of the sensor devices in the facility (block 540). For example, the modeling techniques may be performed to determine a minimum quantity of temperature sensors that can be positioned in the facility while balancing sensor costs and temperature detection as well as interpolation accuracy. The computer system can model various different configurations of temperature sensors per location, region, and/or storage location in the facility. Sometimes, the computer system can determine where to place the sensors in the facility, such as closer to or further away from doors/entrances, closer to ceilings, closer to floors, at midpoints along walls between the ceiling and floor, etc. Various other configurations, quantities, and placements of sensors throughout the facility can be determined to achieve accurate real-time temperature condition determinations, energy savings, and equipment cost savings. In some implementations, once a temperature sensor design layout is tested and modeled in one facility, it can be extrapolated for use in other facilities. The layout can be extrapolated using transfer learning techniques in machine learning. A trained model for a particular facility can be tested/tried in a second facility, then fine-tuned based on measurements at the second facility. Conformal mapping is another technique that can be used for extrapolating the layout in which spaces can be stretched or otherwise manipulated to match other spaces, assuming a core topology is similar enough (e.g., same number of doors on same walls, etc.).

Additionally or alternatively, the computer system can generate one or more recommendations for a minimum quantity of sensor devices that can be used in the facility (block 542). The minimum quantity of sensor devices can be determined as part of determining where to place the sensors in the facility. For example, a machine learning model can be applied to the facility information and/or actual temperature conditions for the facility to determine a minimum quantity of sensor devices and their recommended placement throughout the facility. Any of the determinations made in blocks 532-542 may also be extrapolated and applied to other facilities, as mentioned above.

Next, the computer system can return the instructions and/or recommendations (block 544). The computer system can return the control instructions for execution by one or more components in the facility (block 546). For example, the computer system can transmit the instructions to one or more refrigeration systems in the facility, which can then automatically execute the instructions. Sometimes, the computer system can execute the control instructions to control the components in the facility, such as the refrigeration system(s), fans, etc.

As part of block 544, the computer system can return the recommendations to one or more computing devices of relevant users in the facility (block 548). For example, recommendations for the facility layout and/or placement/quantity of sensor devices in the facility can be sent to the computing device of a relevant warehouse worker. The warehouse worker can review the recommendations, decide to implement the recommendations, and/or modify the recommendations. As another example, the computer system may return the control instructions to the computing device of the relevant worker. The relevant worker may then review the control instructions (such as activating or deactivating one or more refrigeration systems) and determine whether and/or when to implement/execute those instructions. The relevant worker or other user can then provide input that causes the instructions to be automatically executed, as described herein. The relevant worker can also provide input such as modifications to the recommendations and/or instructions, which can be received and used by the computer system to iteratively improve and/or retrain the models described herein.

As part of block 544, the computer system can return the instructions for use in determining grouping and/or storage location information for items in the facility (block 550). For example, the actual temperature conditions of the entire 3D space of the facility can be used by the computer system to determine where to store various inbound items. The instructions to control components in the facility, such as fans and/or refrigeration systems, can additionally or alternatively be used to determine where to store the inbound items in the facility and/or how to group those items. Refer at least to FIGS. 1, 3, and 4 for further discussion about the determinations performed in response to block 550.

Figure 6:
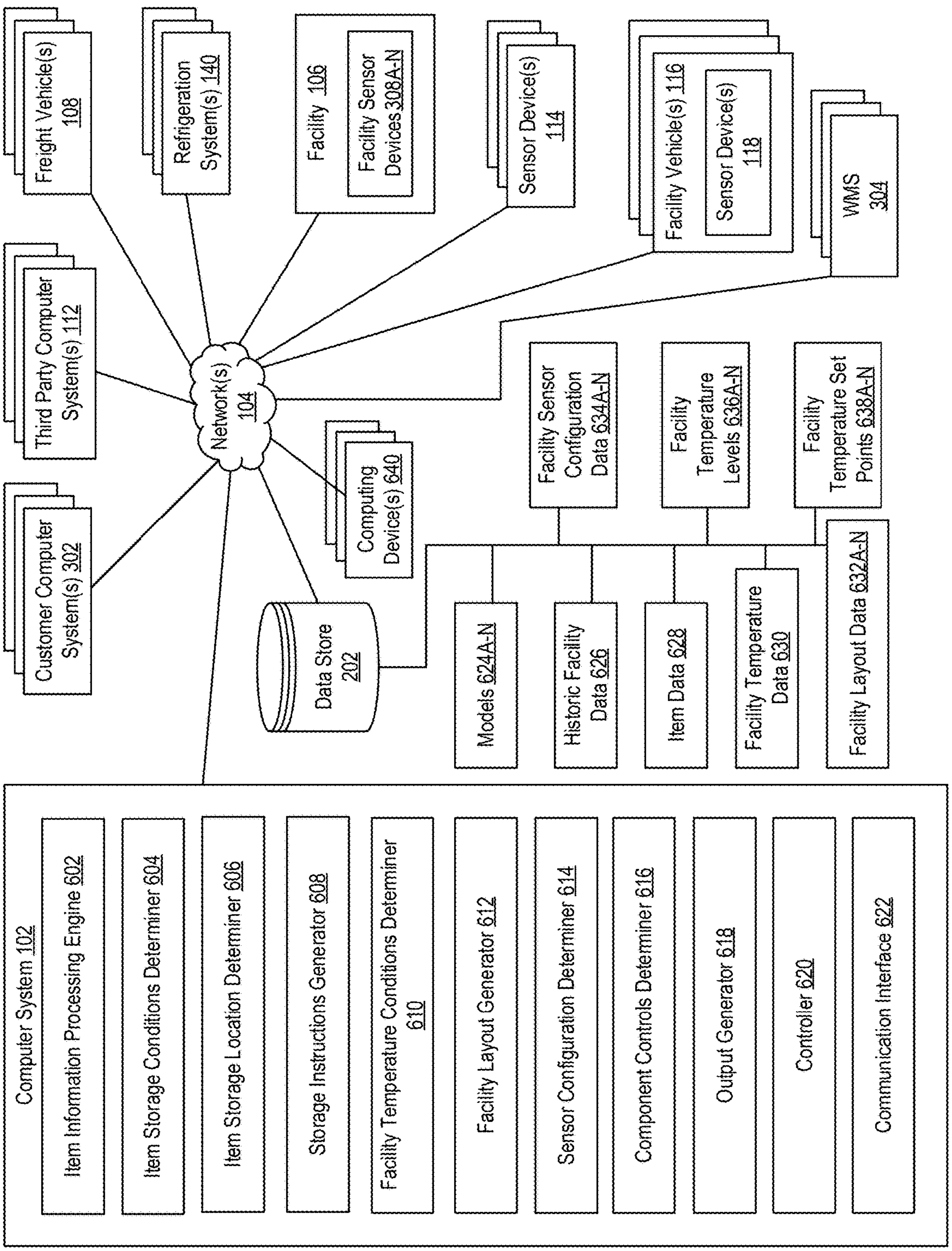
FIG. 6 is a diagram of one or more system components that can be configured to perform the disclosed techniques.

FIG. 6 is a diagram of one or more system components that can be configured to perform the disclosed techniques. The computer system 102, customer computer system(s) 302, third part computer system(s) 112, freight vehicle(s) 108, refrigeration system(s) 140, facility 106 having facility sensor devices 308A-N, sensor device(s) 114, facility vehicle(s) 116 having sensor devices 118, WMS 304, computing devices 640, and data store 202 can communicate with each other via the network(s) 104. The network(s) 104 can be a private internal network, such as a private 5G network.

The data store 202 can be configured to maintain a variety of information and data, including but not limited to models 624A-N, historic facility data 626, item data 628, facility temperature data 630, facility layout data 632A-N, facility sensor configuration data 634A-N, facility temperature levels 636A-N, and facility temperature set points 638A-N. In some implementations, one or more of the data 630, 636A-N, and 638A-N can be more generalized ambient conditions data for any facility, the ambient conditions data indicating temperature, pressure, humidity, and/or other ambient conditions that may exist for the facility. The data maintained by the data store 202 is further described below in reference to at least components of the computer system 102.

The computer system 102 can be a control system configured to maintain consistency and reduce variability in operations, efficiency, and energy usage/costs in the facility 106. The computer system 102 can determine controls for components such as the refrigeration system(s) 140 (e.g., temperatures, activation, deactivation, fan speed, reactivation, etc.), louvers, vanes, etc. throughout the facility 106.

The computer system 102 can also be configured to model impacts of doors opening and other operations performed in the facility 106 to identify potential changes in temperature, pressure, etc. in the facility 106, that way the computer system 102 can be more prescriptive in determining adjustments to the facility 106.

Accordingly, the computer system 102 may include an item information processing engine 602, an item storage conditions determiner 604, an item storage location determiner 606, a storage instructions generator 608, a facility temperature conditions determiner 610, a facility layout generator 612, a sensor configuration determiner 614, a component controls determiner 616, an output generator 618, a controller 620, and a communication interface 622. The communication interface 622 can be configured to provide communication (e.g., wired, wireless) between components of the computer system 102 and other system components over the network(s) 104.

The item information processing engine 602 can be configured to process item information that can be received from the customer computer system(s) 302, the third party computer system(s) 112, the freight vehicle(s) 108, the WMS 304, and/or the data store 202 (as the item data 628). The engine 602 can perform one or more textual and/or semantic analysis techniques described herein to glean item type and/or classification information from the item information. In some implementations, the engine 602 can retrieve one or more of the models 624A-N from the data store 202, such as an AI model, which can be trained and used to identify the item type and/or classification information by analysis of textual descriptions in the item information.

The item storage conditions determiner 604 can be configured to determine actual conditions (e.g., temperature, pressure, humidity, and other ambient conditions) at which each inbound item can be stored in the facility 106. The determiner 604 can retrieve one or more of the models 624A-N from the data store 202 for use in determining the actual storage conditions for the inbound items. For example, as described herein, the determiner 604 can apply a model to the item type and/or classification determined by the item information processing engine 602 to generate output indicating threshold temperature conditions at which the respective item can be stored in the facility 106 while ensuring the item maintains respective safety and quality standards.

The item storage location determiner 606 can use the actual storage conditions identified by the determiner 604 to determine where to store each item in the facility 106. In other words, as described herein, the determiner 606 can match the inbound items with storage locations in the facility 106 based on comparing the actual storage conditions for the items with temperature conditions of available storage locations in the facility 106. The determiner 606 may also group one or more inbound items (that are being delivered on same or different freight vehicle(s) 108, that are associated with same or different customers and/or orders, etc.) for storage in same locations in the facility 106. The determiner 606 can retrieve information from the data store 202 such as the historic facility data 626, the facility temperature data 630, the facility layout data 632A-N, the facility temperature levels 636A-N, and/or the facility temperature set points 638A-N. This retrieved information can be used by the determiner 606 to match the actual storage conditions for each inbound item with temperature conditions in the facility 106. In some implementations, the determiner 606 can poll one or more of the facility sensor devices 308A-N, the sensor device(s) 114, and/or the sensor device(s) 118 of the facility vehicle(s) 116 for real-time temperature readings of different locations in the facility 106. Sometimes, the determiner 606 can receive facility layout information and/or storage conditions information from one or more of the storage locations conditions determiner 610 and/or the facility layout generator 610.

The storage instructions generator 608 can be configured to generate instructions for routing the inbound items from a dock area in the facility 106 where the items are unloaded from freight vehicle(s) 108 to the storage locations that are determined by the item storage location determiner 606. Sometimes, the items may already be unloaded in the facility 106, and the generator 608 can generate instructions to move the items from their current locations to their identified storage locations. The generator 608 can generate tasks and/or operations to be performed by various relevant human workers and/or the facility vehicle(s) 116. The generator 608 may also provide the instructions to computing devices 640 of the relevant human workers and/or the facility vehicle(s) 116 for execution. Sometimes, the generator 608 can transmit the instructions to the WMS 304, an inventory management system, the data store 202, or other relevant computing systems, which can handle the instructions accordingly (e.g., transmit the instructions to the appropriate computing devices 640 and/or facility vehicle(s) 116 for execution).

The facility temperature conditions determiner 610 can be configured to determine actual temperature conditions in various locations and/or regions throughout the facility 106. As described throughout this disclosure, the determiner 610 can be configured to identify temperature conditions throughout the facility 106, based on temperature readings received from the facility sensor devices 308A-N, the sensor device(s) 114, and/or the sensor device(s). The determiner 610 can retrieve one or more of the models 624A-N from the data store 202 and use those models 624A-N to interpolate temperature conditions in every square meter of the facility 106, including regions or locations in the facility 106 between the facility sensor devices 308A-N, the sensor devices 114, and/or the sensor devices 118 and/or regions or locations in the facility 106 that may not include the facility sensor devices 308A-N, the sensor devices 114, and/or the sensor devices 118.

Sometimes, the determiner 610 can retrieve other information from the data store 202, such as the historic facility data 626, the facility temperature data 630, the facility layout data 632A-N, and the facility sensor configuration data 634A-N, which can be used to determine the actual temperature conditions throughout the 3D space of the facility 106. The historic facility data 626 can include previous temperature conditions that have been determined for various regions and/or locations in the facility 106. The historic facility data 626 can be provided as input to the one or more models 624A-N to determine the current, actual conditions. The facility temperature data 630 can include real-time or near real-time temperature data that is captured by the sensor devices 308A-N, 114, and 118, and stored in the data store 202 before being transmitted to other systems, such as the computer system 102. The facility layout data 632A-N can include location data for the sensor devices 308A-N, 114, and 118 positioned throughout the facility 106. The data 632A-N can be used by the determiner 610 to identify locations of the sensor devices, triangulate those locations, identify gaps between those locations, and interpolate actual temperature conditions for those gaps between sensor devices in the facility 106. Similarly, the facility sensor configuration data 634A-N can include locations of the sensor devices 308A-N, 114, and 118 in the facility 106, which can be used similarly to the facility layout data 632A-N.

The facility layout generator 612 can be configured to determine and/or modify a layout of locations and/or regions in the facility, based on actual temperature conditions that are determined by the facility temperature conditions determiner 610. The generator 612 may retrieve the historic facility data 626 and/or the facility layout data 632A-N from the data store 202. The historic facility data 626 can provide previous/historic layouts and/or layout modifications for the facility 106 as well as temperature conditions of the facility during those previous/historic times. This historic facility data 626 can be used by the generator 612 to determine whether the current facility layout can be modified to any previous facility layout where similar actual temperature conditions existed. Sometimes, the generator 612 can implement one or more machine learning models 624A-N, which can receive the historic facility data 626 as input to determine an optimal, modified layout for the facility 106. The generator 612 can determine modifications to the facility layout data 632A-N, which can include identification of locations and/or regions in the facility 106 as designated temperature zones, freezer zones, etc.

The sensor configuration determiner 614 can be configured to determine and/or modify a configuration or layout of the sensor devices 308A-N and/or 114 within the facility 106. The determiner 614 can retrieve information from the data store 202, such as the historic facility data 626, the facility layout data 632A-N, and/or the facility sensor configuration data 634A-N, which can be used by the determiner 614 to determine whether fewer or additional sensor devices 308A-N and/or 114 should be placed within the facility 106. The determiner 614 can also use the retrieved information (and the modified facility layout from the facility layout generator 612) to determine placement of the sensor devices 308A-N and/or 114, such as in particular locations and/or regions having no sensors or an insufficient quantity of sensor devices, closer to doorways and/or entrances, closer to ceilings, closer to floors, proximate corners furthest away from fans, refrigeration systems, doorways, and/or entrances, etc. Sometimes, the determiner 614 can retrieve one or more of the models 624A-N, which can generate an optimal sensor configuration based on the retrieved information.

The component controls determiner 616 can be configured to determine whether changes should be made to temperature conditions in one or more locations and/or regions in the facility 106. The determiner 616 can receive the actual temperature conditions from the facility temperature conditions determiner 610, real-time temperature readings from the sensor devices 308A-N, 114, and/or 118, and/or the stored facility temperature data 630. The determiner 616 can also retrieve the facility temperature levels 636A-N and/or the facility temperature set points 638A-N from the data store 202, which the determiner 616 can compare against the actual temperature conditions for the facility 106. The determiner 616 can then determine controls for components such as the refrigeration system(s) 140, as described herein, based on the comparison (e.g., whether the actual temperature conditions for a particular location or room are trending within the respective facility temperature levels 636A-N and/or set points 638A-N.

The output generator 618 can be configured to generate output for one or more components described herein. The output can be generated based on the storage instructions generated by the generator 608, the facility layout modifications from the generator 612, the sensor configuration from the determiner 614, and/or the component controls from the determiner 616. The output generator 618 can also transmit any of the output to the receiving components, such as the computing device(s) 640, the customer computer system(s) 302, the third party computer system(s) 112, the freight vehicle(s) 108, the refrigeration system(s) 140, the facility vehicle(s) 116, and/or the WMS 304.

The controller 620 can be configured to execute any of the instructions and/or controls that are generated by the components of the computer system 102 and described herein. In some implementations, each component of the facility 106, such as each of the refrigeration system(s) 140 may have their respective controller(s), which can be configured to execute instructions generated by the computer system 102.

Figure 7:
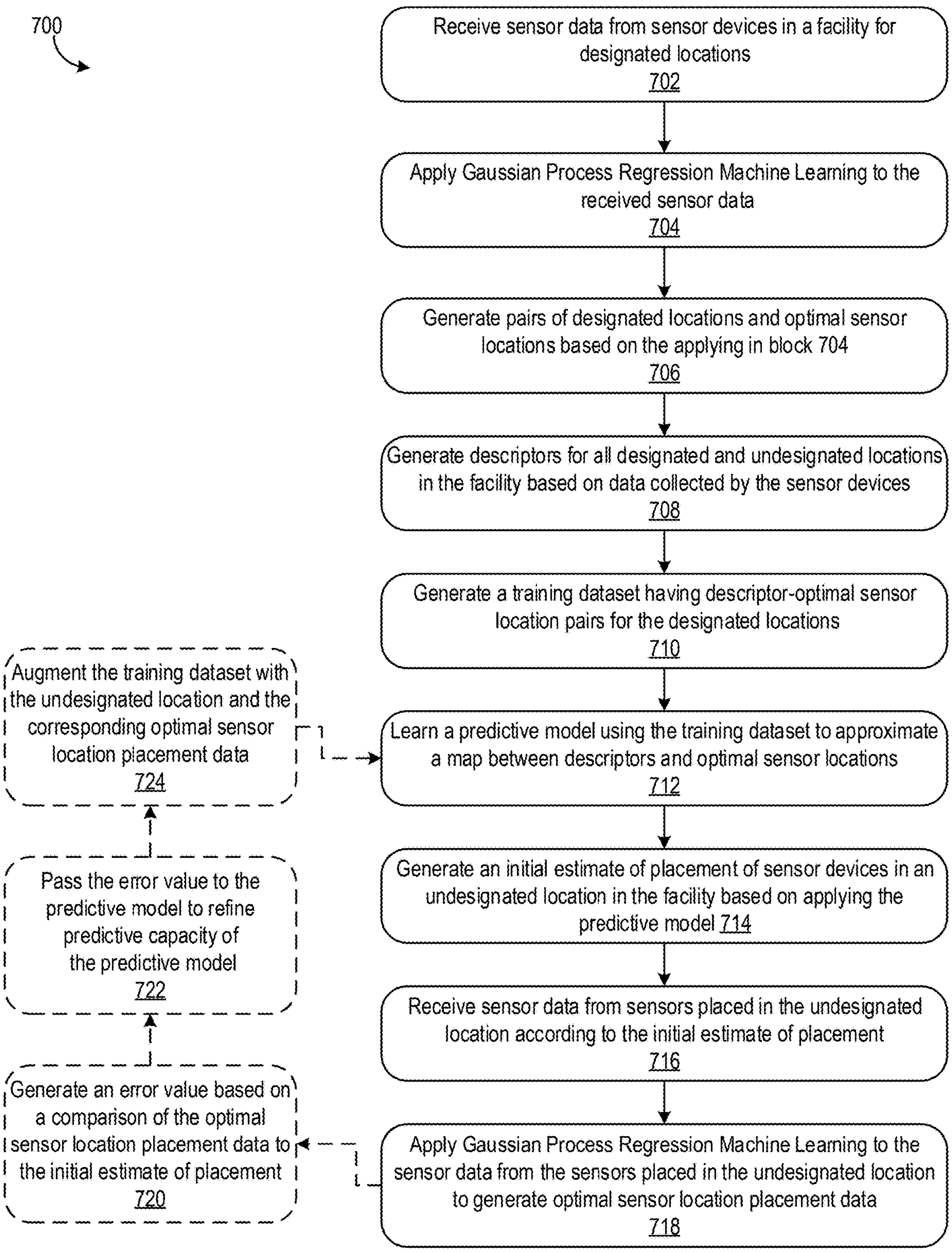
FIG. 7 is a flowchart of a process for determining sensor placement in undesignated locations in a facility, such as new rooms or storage locations.

FIG. 7 is a flowchart of a process 700 for determining sensor placement in undesignated locations in a facility, such as new rooms or storage locations. The process 700 can be performed by the computer system 102 describe herein. The process 700 can be performed by any other computing system, controller, network of computing devices, edge devices, user devices, and/or cloud-based systems. For illustrative purposes, the process 700 is described from the perspective of a computer system.

The computer system can receive sensor data from sensor devices in a facility for designated locations (block 702). The designated locations can include known or existing rooms, such as storage rooms, in the facility.

The computer system can apply Gaussian Process Regression Machine Learning to the received sensor data in block 704. To predict new values, this machine learning technique can use a variogram, a measure of statistical dependence between two points calculated as a function of a distance between the points (oftentimes assuming an isotropic distribution). This can be based on an expected value of a square of a temperature difference between two sampled points. A calculated experimental variogram for all pairs of points can be calculated and fit to a theoretical variogram, resulting in a function that can predict spatial dependence of given points. For temperature, this fit function can take the form of a Gaussian model. The model can introduce constant parameters: a least possible variance between points at a minimum positive distance, a value for points as far apart as possible, and a measure of how far apart two points can potentially be for data from one to have any meaningful impact on what data would be obtained from the other point. These parameters can be derived by fitting the data from the experimental variogram to the model.

Based on applying the machine learning of block 704, the computer system can generate pairs of designated locations and optimal sensor locations in block 706.

The computer system can also generate descriptors for all designated and undesignated locations in the facility based on data collected by the sensor devices in block 708. For example, the computer system can generate descriptors for rooms that already have sensor devices placed as well as new rooms that don't yet have sensor devices placed herein. The descriptors can provide information relevant to data being collected by those sensors. As an example, locations of cooling fans can be a relevant descriptor associated with temperature data of temperature sensors. A unifying factor present among all descriptors (or a subset of descriptors) can include that one must have access to them for a new room before installation of any sensor. For example, historic sensor data may not fall into this category. Other relevant descriptors can include, but are not limited to, locations of doors, sizes of rooms, etc. Each descriptor can be described numerically (e.g., location within a room can be described using a coordinate system). Useful descriptors can also be generated from sources that may be less easy to quantify. An illustrative example includes a floorplan itself. In some implementations, however, by using image processing algorithms, such as convolutional neural networks, images of the floorplan can be vectorized and used as descriptors as well.

Then, the computer system can generate a training dataset having descriptor-optimal sensor location pairs for the designated locations (block 710). In other words, for the designated locations (e.g., rooms) already having sensor devices placed, such as by using Gaussian Process Regression Machine Learning, the dataset can be formed, consisting of the descriptor-optimal sensor location pairs. As a result, ground truth variables of variables to predict (the optimal sensor placement locations) can be paired with corresponding values from variables used to predict sensor placement in undesignated locations or rooms.

Using the training dataset, the computer system can learn a predictive model to approximate a map between descriptors and optimal sensor locations (block 712). Regression analysis can be used for estimating values of some dependent variable (optimal sensor location) based on independent variables (descriptors). Using machine learning techniques such as neural networks and/or other regression analysis techniques from statistical modeling, the predictive model can be learned from this dataset to approximate the map between descriptors and optimal sensor locations.

The computer system can generate an initial estimate of placement of sensor devices in an undesignated location in the facility based on applying the predictive model (block 714). Advantageously, the predictive model can generate the initial estimate by requiring less sensor devices to be installed than a full sensor grid. In addition, the predictive model allows the initial estimate output to become more accurate over time, as the predictive model receives data associated with more locations and iteratively learns where it makes mistakes, such as based on and using feedback from the Gaussian Process Regression Machine Learning described above.

Instructions for placing the sensor devices according to the initial estimate can be transmitted to relevant computing devices for implementation. For example, warehouse/facility workers can receive the instructions and place the sensor devices in the particular undesignated location based on the initial estimate of placement. Once placed, those sensor devices can collect data.

The computer system can then receive sensor data from sensor devices placed in the undesignated location according to the initial estimate of placement (block 716).

In block 718, the computer system can apply the Gaussian Process Regression Machine Learning described above to the sensor data from the sensors placed in the undesignated location to generate optimal sensor location placement data. These locations can be considered as a refinement of the initial estimate provided by the predictive model.

In some implementations, the process 700 can then stop. Sometimes, the process 700 can continue with performance of blocks 720, 722, and 724.

In block 720, the computer system can generate an error value based on a comparison of the optimal sensor location placement data to the initial estimate of placement.

The computer system can then pass the error value to the predictive model to refine a predictive capacity of the predictive model in block 722.

In block 724, the computer system can augment the training dataset with the undesignated location and the corresponding optimal sensor location placement data. The computer system can then proceed to block 712 and repeat one or more blocks of the process 700 described above.

Given a certain acceptable level of error, the process 700 can be performed by placing sensors at corner positions of a designated location in the facility, such as a room. The data at every potential sensor point can be interpolated from the placed sensors, then compared against real data. A sensor can then be placed at a spot of maximum interpolation error. This process can continue, incorporating data from the new sensor each time one is placed, thereby reducing total error in the room. Once the error falls below an acceptable threshold at a given time, no further sensors may be placed. The points that had sensors at the end of this process can be tallied across every timestamp, essentially creating a histogram that measures how useful it would be to have a sensor at each point. Through this process, the possible sensor positions can be ranked in terms of how useful they were and/or how much of the time. Continuing this process over a wide, representative sample of times can allow for a determination of where sensors can be placed for maximum acquisition of information using the fewest sensors possible while still remaining under the desired level of error.

Figure 8:
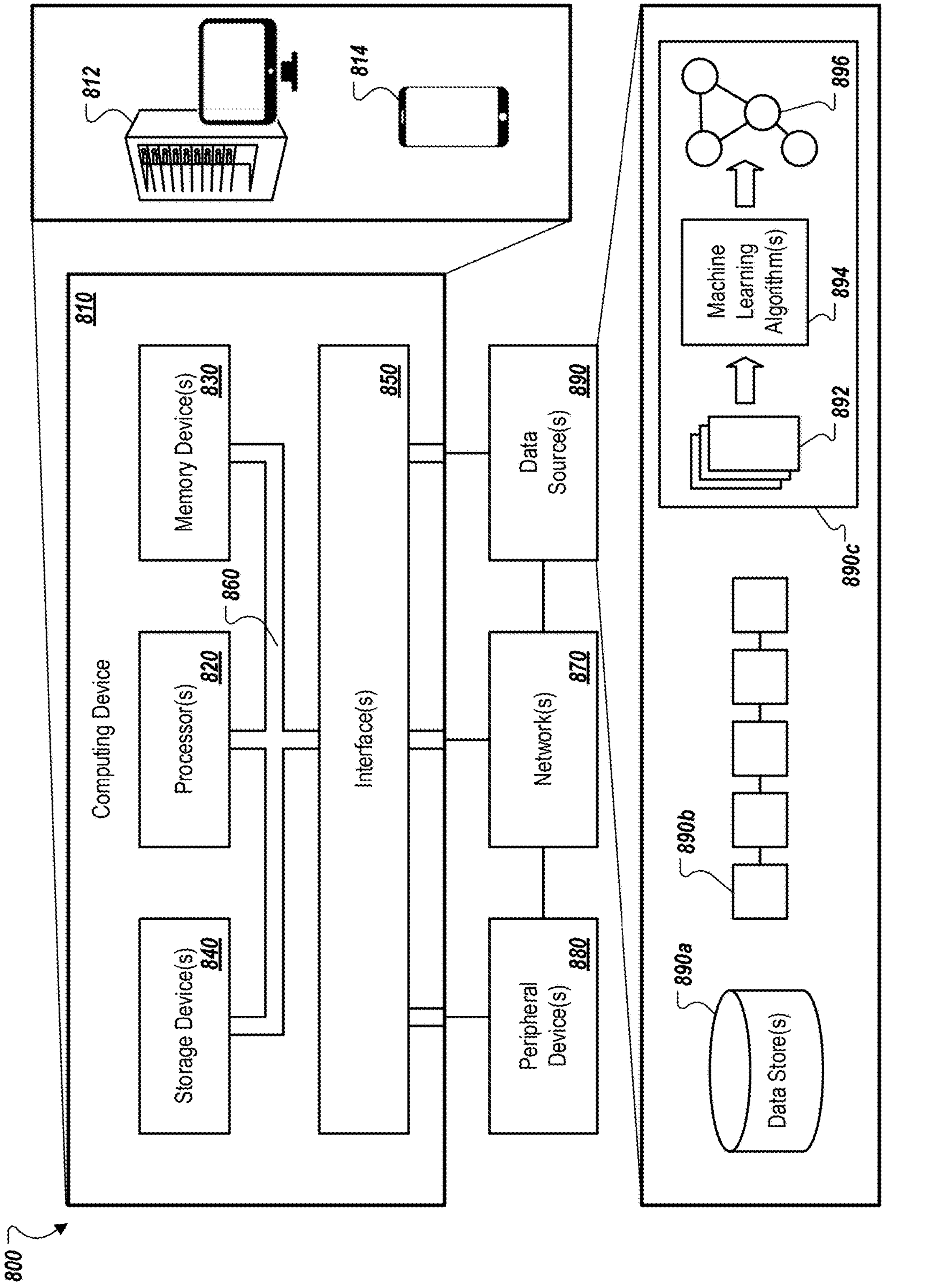
FIG. 8 is a schematic diagram that shows an example of a computing device and a mobile computing device.

FIG. 8 is a schematic diagram that shows an example of a computing system 800 that can be used to implement the techniques described herein. The computing system 800 includes one or more computing devices (e.g., computing device 810), which can be in wired and/or wireless communication with various peripheral device(s) 880, data source(s) 890, and/or other computing devices (e.g., over network(s) 870). The computing device 810 can represent various forms of stationary computers 812 (e.g., workstations, kiosks, servers, mainframes, edge computing devices, quantum computers, etc.) and mobile computers 814 (e.g., laptops, tablets, mobile phones, personal digital assistants, wearable devices, etc.). In some implementations, the computing device 810 can be included in (and/or in communication with) various other sorts of devices, such as data collection devices (e.g., devices that are configured to collect data from a physical environment, such as microphones, cameras, scanners, sensors, etc.), robotic devices (e.g., devices that are configured to physically interact with objects in a physical environment, such as manufacturing devices, maintenance devices, object handling devices, etc.), vehicles (e.g., devices that are configured to move throughout a physical environment, such as automated guided vehicles, manually operated vehicles, etc.), or other such devices. Each of the devices (e.g., stationary computers, mobile computers, and/or other devices) can include components of the computing device 810, and an entire system can be made up of multiple devices communicating with each other. For example, the computing device 810 can be part of a computing system that includes a network of computing devices, such as a cloud-based computing system, a computing system in an internal network, or a computing system in another sort of shared network. Processors of the computing device (810) and other computing devices of a computing system can be optimized for different types of operations, secure computing tasks, etc. The components shown herein, and their functions, are meant to be examples, and are not meant to limit implementations of the technology described and/or claimed in this document.

The computing device 810 includes processor(s) 820, memory device(s) 830, storage device(s) 840, and interface(s) 850. Each of the processor(s) 820, the memory device(s) 830, the storage device(s) 840, and the interface(s) 850 are interconnected using a system bus 860. The processor(s) 820 are capable of processing instructions for execution within the computing device 810, and can include one or more single-threaded and/or multi-threaded processors. The processor(s) 820 are capable of processing instructions stored in the memory device(s) 830 and/or on the storage device(s) 840. The memory device(s) 830 can store data within the computing device 810, and can include one or more computer-readable media, volatile memory units, and/or non-volatile memory units. The storage device(s) 840 can provide mass storage for the computing device 810, can include various computer-readable media (e.g., a floppy disk device, a hard disk device, a tape device, an optical disk device, a flash memory or other similar solid state memory device, or an array of devices, including devices in a storage area network or other configurations), and can provide date security/encryption capabilities.

The interface(s) 850 can include various communications interfaces (e.g., USB, Near-Field Communication (NFC), Bluetooth, WiFi, Ethernet, wireless Ethernet, etc.) that can be coupled to the network(s) 870, peripheral device(s) 880, and/or data source(s) 890 (e.g., through a communications port, a network adapter, etc.). Communication can be provided under various modes or protocols for wired and/or wireless communication. Such communication can occur, for example, through a transceiver using a radio-frequency. As another example, communication can occur using light (e.g., laser, infrared, etc.) to transmit data. As another example, short-range communication can occur, such as using Bluetooth, WiFi, or other such transceiver. In addition, a GPS (Global Positioning System) receiver module can provide location-related wireless data, which can be used as appropriate by device applications. The interface(s) 850 can include a control interface that receives commands from an input device (e.g., operated by a user) and converts the commands for submission to the processors 820. The interface(s) 850 can include a display interface that includes circuitry for driving a display to present visual information to a user. The interface(s) 850 can include an audio codec which can receive sound signals (e.g., spoken information from a user) and convert it to usable digital data. The audio codec can likewise generate audible sound, such as through an audio speaker. Such sound can include real-time voice communications, recorded sound (e.g., voice messages, music files, etc.), and/or sound generated by device applications.

The network(s) 870 can include one or more wired and/or wireless communications networks, including various public and/or private networks. Examples of communication networks include a LAN (local area network), a WAN (wide area network), and/or the Internet. The communication networks can include a group of nodes (e.g., computing devices) that are configured to exchange data (e.g., analog messages, digital messages, etc.), through telecommunications links. The telecommunications links can use various techniques (e.g., circuit switching, message switching, packet switching, etc.) to send the data and other signals from an originating node to a destination node. In some implementations, the computing device 810 can communicate with the peripheral device(s) 880, the data source(s) 890, and/or other computing devices over the network(s) 870. In some implementations, the computing device 810 can directly communicate with the peripheral device(s) 880, the data source(s), and/or other computing devices.

The peripheral device(s) 880 can provide input/output operations for the computing device 810. Input devices (e.g., keyboards, pointing devices, touchscreens, microphones, cameras, scanners, sensors, etc.) can provide input to the computing device 810 (e.g., user input and/or other input from a physical environment). Output devices (e.g., display units such as display screens or projection devices for displaying graphical user interfaces (GUIs)), audio speakers for generating sound, tactile feedback devices, printers, motors, hardware control devices, etc.) can provide output from the computing device 810 (e.g., user-directed output and/or other output that results in actions being performed in a physical environment). Other kinds of devices can be used to provide for interactions between users and devices. For example, input from a user can be received in any form, including visual, auditory, or tactile input, and feedback provided to the user can be any form of sensory feedback (e.g., visual feedback, auditory feedback, or tactile feedback).

The data source(s) 890 can provide data for use by the computing device 810, and/or can maintain data that has been generated by the computing device 810 and/or other devices (e.g., data collected from sensor devices, data aggregated from various different data repositories, etc.). In some implementations, one or more data sources can be hosted by the computing device 810 (e.g., using the storage device(s) 840). In some implementations, one or more data sources can be hosted by a different computing device. Data can be provided by the data source(s) 890 in response to a request for data from the computing device 810 and/or can be provided without such a request. For example, a pull technology can be used in which the provision of data is driven by device requests, and/or a push technology can be used in which the provision of data occurs as the data becomes available (e.g., real-time data streaming and/or notifications). Various sorts of data sources can be used to implement the techniques described herein, alone or in combination.

In some implementations, a data source can include one or more data store(s) 890*a*. The database(s) can be provided by a single computing device or network (e.g., on a file system of a server device) or provided by multiple distributed computing devices or networks (e.g., hosted by a computer cluster, hosted in cloud storage, etc.). In some implementations, a database management system (DBMS) can be included to provide access to data contained in the database(s) (e.g., through the use of a query language and/or application programming interfaces (APIs)). The database(s), for example, can include relational databases, object databases, structured document databases, unstructured document databases, graph databases, and other appropriate types of databases.

In some implementations, a data source can include one or more blockchains 890*b*. A blockchain can be a distributed ledger that includes blocks of records that are securely linked by cryptographic hashes. Each block of records includes a cryptographic hash of the previous block, and transaction data for transactions that occurred during a time period. The blockchain can be hosted by a peer-to-peer computer network that includes a group of nodes (e.g., computing devices) that collectively implement a consensus algorithm protocol to validate new transaction blocks and to add the validated transaction blocks to the blockchain. By storing data across the peer-to-peer computer network, for example, the blockchain can maintain data quality (e.g., through data replication) and can improve data trust (e.g., by reducing or eliminating central data control).

In some implementations, a data source can include one or more machine learning systems 890*c*. The machine learning system(s) 890*c*, for example, can be used to analyze data from various sources (e.g., data provided by the computing device 810, data from the data store(s) 890*a*, data from the blockchain(s) 890*b*, and/or data from other data sources), to identify patterns in the data, and to draw inferences from the data patterns. In general, training data 892 can be provided to one or more machine learning algorithms 894, and the machine learning algorithm(s) can generate a machine learning model 896. Execution of the machine learning algorithm(s) can be performed by the computing device 810, or another appropriate device. Various machine learning approaches can be used to generate machine learning models, such as supervised learning (e.g., in which a model is generated from training data that includes both the inputs and the desired outputs), unsupervised learning (e.g., in which a model is generated from training data that includes only the inputs), reinforcement learning (e.g., in which the machine learning algorithm(s) interact with a dynamic environment and are provided with feedback during a training process), or another appropriate approach. A variety of different types of machine learning techniques can be employed, including but not limited to convolutional neural networks (CNNs), deep neural networks (DNNs), recurrent neural networks (RNNs), and other types of multi-layer neural networks.

Various implementations of the systems and techniques described herein can be realized in digital electronic circuitry, integrated circuitry, specially designed ASICs (application specific integrated circuits), computer hardware, firmware, software, and/or combinations thereof. A computer program product can be tangibly embodied in an information carrier (e.g., in a machine-readable storage device), for execution by a programmable processor. Various computer operations (e.g., methods described in this document) can be performed by a programmable processor executing a program of instructions to perform functions of the described implementations by operating on input data and generating output. The described features can be implemented in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, by a computer to perform a certain activity or bring about a certain result. A computer program can be written in any form of programming language, including compiled or interpreted languages, and can be deployed in any form, including as a stand-alone program or as a module, component, subroutine, or other unit suitable for use in a computing environment. A computer program product can be a computer- or machine-readable medium, such as a storage device or memory device. As used herein, the terms machine-readable medium and computer-readable medium refer to any computer program product, apparatus and/or device (e.g., magnetic discs, optical disks, memory, etc.) used to provide machine instructions and/or data to a programmable processor, including a machine-readable medium that receives machine instructions as a machine-readable signal. The term machine-readable signal refers to any signal used to provide machine instructions and/or data to a programmable processor.

Suitable processors for the execution of a program of instructions include, by way of example, both general and special purpose microprocessors, and can be a single processor or one of multiple processors of any kind of computer. Generally, a processor will receive instructions and data from a read-only memory or a random access memory or both. The elements of a computer are a processor for executing instructions and one or more memory devices for storing instructions and data. Generally, a computer can also include, or can be operatively coupled to communicate with, one or more mass storage devices for storing data files. Such devices can include magnetic disks (e.g., internal hard disks and/or removable disks), magneto-optical disks, and optical disks. Storage devices suitable for tangibly embodying computer program instructions and data can include all forms of non-volatile memory, including by way of example semiconductor memory devices, flash memory devices, magnetic disks (e.g., internal hard disks and removable disks), magneto-optical disks, and optical disks. The processor and the memory can be supplemented by, or incorporated in, ASICs (application-specific integrated circuits).

The systems and techniques described herein can be implemented in a computing system that includes a back end component (e.g., a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). The computer system can include clients and servers, which can be generally remote from each other and typically interact through a network, such as the described one. The relationship of client and server arises by virtue of computer programs running on the respective computers and having a client-server relationship to each other.

In one implementation, the innovation is generally directed to systems and methods for sensor placement in a facility. This innovation can include system for determining sensor placement in a facility, the system including: one or more sensor devices positioned throughout the facility and a computer system that can be in communication, via a private communication network, with the one or more sensor devices. The computer system can be configured to: receive temperature readings from the one or more sensor devices, model the temperature readings to determine actual temperature information for a three-dimensional (3D) space of the facility, determine whether the actual temperature information for the 3D space is trending within expected temperature levels for the facility, and based on the determination, generate output that can include modifications to a layout of the one or more sensor devices in the facility.

In another implementation, the innovation is generally directed to systems and methods for product classification and storage safety conditions in a facility. This innovation can include a system for classifying items and determining storage safety conditions for the items in a facility, the system including processors and memory storing instructions that, when executed by the processors, can cause the processors to perform a process that may include: receiving item information for an inbound item to the facility from one or more external data systems, determining an item classification for the inbound item based on applying a model to the item information, determining actual storage conditions for the inbound item based on the item classification, and returning information about the actual storage conditions for the inbound item.

In one implementation, the innovation is generally directed to temperature-based item storage in a facility. This innovation can include a system for determining storage information for items in a facility, the system including processors and memory storing instructions that, when executed by the processors, can cause the processors to perform a process that may include: receiving item information for inbound items to a facility, receiving real-time ambient conditions information for the facility, determining an item classification for each of the inbound items based on processing the respective item information, determining storage conditions for each of the inbound items based on the item classification for the respective inbound item and the real-time ambient conditions information, matching the inbound items to storage locations in the facility based on the determined storage conditions for each of the inbound items, and returning information based on the matching.

In one implementation, the innovation is generally directed to systems and methods for determining temperatures in a facility and temperature controls therein. This innovation can include a system for interpolating ambient conditions across a facility, the system including sensor devices that can be configured to generate sensor data indicating ambient conditions in a facility, where a first portion of the sensor devices can be positioned in different locations of the facility and a second portion of the sensor devices can be attached to vehicles that move amongst the different locations of the facility, and a computer system in data communication with the sensor devices. The computer system can perform a process that may include: receiving the sensor data from the sensor devices, determining real-time temperature information for the different locations of the facility based on processing the sensor data, interpolating the real-time temperature information to determine real-time temperature information for the facility, and returning the real-time temperature information for the facility.

In another implementation, the innovation is generally directed to systems and methods for controlling a facility based on temperature. This innovation can include a system for controlling components in a facility to improve energy efficiency and consumption in the facility, the system including sensor devices positioned throughout the facility, facility components that can be automatically controlled to perform operations in the facility, and a computer system that can be in communication, via a private communication network, with the sensor devices and the facility components. The computer system can perform a process that may include: receiving temperature readings from the one or more sensor devices, modeling the temperature readings to determine actual temperature information for the facility, determining whether the actual temperature information for the facility is trending within expected temperature levels for the facility, based on the determination, generating instructions for controlling the facility components, and returning the instructions to cause the facility components to be automatically controlled according to the instructions.

While this specification contains many specific implementation details, these should not be construed as limitations on the scope of the disclosed technology or of what may be claimed, but rather as descriptions of features that may be specific to particular embodiments of particular disclosed technologies. Certain features that are described in this specification in the context of separate embodiments can also be implemented in combination in a single embodiment in part or in whole. Conversely, various features that are described in the context of a single embodiment can also be implemented in multiple embodiments separately or in any suitable subcombination. Moreover, although features may be described herein as acting in certain combinations and/or initially claimed as such, one or more features from a claimed combination can in some cases be excised from the combination, and the claimed combination may be directed to a subcombination or variation of a subcombination. Similarly, while operations may be described in a particular order, this should not be understood as requiring that such operations be performed in the particular order or in sequential order, or that all operations be performed, to achieve desirable results. Particular embodiments of the subject matter have been described. Other embodiments are within the scope of the following claims.

What is claimed is:

1. A system for determining storage information for items in a facility, the system comprising:

a plurality of facility vehicles operating within a facility; and a computer system in communication with the plurality of facility vehicles, wherein the computer system comprises processors and memory storing instructions that, when executed by the processors, causes the processors to perform a process comprising:

receiving item information for inbound items to a facility;

receiving, from a plurality of sensor devices (i) at stationary positions within the facility and (ii) attached to the plurality of facility vehicles as they move throughout the facility, real-time ambient conditions information for the facility, wherein the real-time ambient conditions comprise at least temperature readings at different locations throughout the facility;

determining an item classification for each of the inbound items based on processing the respective item information;

determining storage conditions for each of the inbound items based at least in part on identifying storage locations in the facility having the real-time ambient conditions information that satisfies expected ambient conditions for the item classification for the respective inbound item;

matching the inbound items to the storage locations in the facility based on the determined storage conditions for each of the inbound items;

generating information based on the matching, wherein the information comprises instructions for routing each of the inbound items to the respective matched storage location; and returning the information to the plurality of facility vehicles for automatic execution of the instructions, wherein the plurality of facility vehicles is further configured to, based on receiving the information, automatically execute the instructions to cause the plurality of facility vehicles to route each of the inbound items from a current location to the respective matched storage location in the facility.

2. The system of claim 1, wherein determining the storage conditions comprises:

identifying, based on the item classification, a type of commodity of each of the inbound items; and determining, based on the type of commodity of each of the inbound items, a range of acceptable storage conditions for the inbound item.

3. The system of claim 2, wherein the type of commodity comprises meat proteins and the range of acceptable storage conditions for the meat proteins has an upper control limit of 5 degrees Fahrenheit.

4. The system of claim 1, wherein determining the storage conditions is further based on applying a model that was trained to determine the storage conditions based on a packaging used for each of the inbound items.

5. The system of claim 1, wherein determining the storage conditions for each of the inbound items comprises applying a model to the item classification and the real-time ambient conditions information, wherein the model was trained to determine the storage conditions for each item classification type that satisfy one or more threshold safety criteria corresponding to the item classification type.

6. The system of claim 1, the process further comprising:
- grouping one or more of the inbound items having respective storage location matches that satisfy one or more grouping criteria;
- generating instructions for routing the grouped inbound items to a storage location amongst the respective storage location matches; and
- returning the instructions for automated execution by moving machines in the facility.

7. The system of claim 1, wherein the real-time ambient conditions information is determined by the computer system in a process that comprises:
- determining temperature information for one or more locations in the facility based on processing sensor data received from the plurality of sensor devices, wherein the one or more locations comprise the storage locations; and
- interpolating the determined temperature information to generate the real-time ambient conditions information.

8. The system of claim 7, wherein interpolating the determined temperature information comprises:

- retrieving a model that was trained using historic facility data to interpolate ambient conditions across a 3D space of the facility based on the temperature information; and
- applying the model to the real-time temperature information to generate the real-time ambient conditions information.

9. The system of claim 1, the process further comprising:
- determining whether the real-time ambient conditions information is within expected threshold levels for the facility;
- based on a determination that the real-time ambient conditions information is not within the expected threshold levels, generating component controls for adjusting ambient conditions in one or more of the different locations of the facility; and
- returning the component controls to facility components for automated execution.

10. The system of claim 9, wherein:
- the facility components comprise a refrigeration system in the facility, and
- the component controls comprise instructions to activate or deactivate the refrigeration system for a predetermined period of time,
- wherein in response to (i) the real-time ambient conditions information being within a threshold of expected ambient conditions for the facility, the process further comprises: generating instructions that cause the refrigeration system to reduce a cool air supply to a corresponding portion of the facility for the predetermined period of time.

* * * * *